United States Patent
Kim et al.

(10) Patent No.: US 9,322,849 B2
(45) Date of Patent: Apr. 26, 2016

(54) METHODS AND SYSTEMS FOR CLEANING NEEDLES OF A PROBE CARD

(71) Applicant: Samsung Electronics Co., Ltd., Suwon-si (KR)

(72) Inventors: Do-Yun Kim, Gyeonggi-do (KR); In-Seok Hwang, Gyeonggi-do (KR); Sang-Boo Kang, Gyeonggi-do (KR)

(73) Assignee: Samsung Electronics Co., Ltd. (KR)

( * ) Notice: Subject to any disclaimer, the term of this patent is extended or adjusted under 35 U.S.C. 154(b) by 615 days.

(21) Appl. No.: 13/749,066

(22) Filed: Jan. 24, 2013

(65) Prior Publication Data

US 2013/0200914 A1 Aug. 8, 2013

(30) Foreign Application Priority Data

Feb. 6, 2012 (KR) ........................ 10-2012-0011904

(51) Int. Cl.
*G01R 31/00* (2006.01)
*G01R 1/073* (2006.01)
*G01R 3/00* (2006.01)

(52) U.S. Cl.
CPC .............. *G01R 1/07342* (2013.01); *G01R 3/00* (2013.01)

(58) Field of Classification Search
CPC .............................. G01R 1/07342; G01R 3/00
USPC ..................................................... 324/756.03
See application file for complete search history.

(56) References Cited

U.S. PATENT DOCUMENTS 5,977,787 A * 11/1999 Das et al. ................. 324/755.06
2010/0038560 A1 * 2/2010 Tokura et al. .............. 250/492.1

FOREIGN PATENT DOCUMENTS

| JP | 2002-176079 | | 6/2002 |
| KR | 1020020018285 | A | 3/2002 |
| KR | 1020070024798 | A | 3/2007 |
| KR | 100753859 | B1 | 8/2007 |

* cited by examiner

*Primary Examiner* — Daniel Miller
(74) *Attorney, Agent, or Firm* — Myers Bigel & Sibley, P.A.

(57) ABSTRACT

A method of cleaning needles of a probe card in a test system includes mounting the probe card, which has a plurality of device under tests (DUTs) and needles, in a card mounting part. The DUTs and needles are scanned using a camera positioned in the test system to provide a scan result. A laser beam is focused on at least one of the needles based on the scan result and the laser beam is irradiated on the at least one of the needles to clean the at least one of the needles.

17 Claims, 20 Drawing Sheets

METHODS AND SYSTEMS FOR CLEANING NEEDLES OF A PROBE CARD

CROSS-REFERENCE TO RELATED APPLICATION

This application claims priority under 35 U.S.C. §119 to Korean Patent Application No. 10-2012-0011904 filed on Feb. 6, 2012, the disclosure of which is hereby incorporated by reference in its entirety.

BACKGROUND

Embodiments of the inventive concept relate to a test system and, more particularly, a test system capable of auto-focusing and auto-cleaning needles of a probe card and methods of using the same.

The advancement of semiconductor technology has led to the development of various semiconductor devices, thus resulting in the use of various probe cards having different shapes, sizes, and weights. Also, manufacturers of probe cards are manufacturing respectively distinct formatted probe cards without complying with uniform standards. Accordingly, as needles of the probe cards are provided in diverse shapes in various positions, processes of testing a wafer using the probe card and cleaning the needles of the probe card may be mechanically or physically performed using an operator's naked eyes.

SUMMARY

Some embodiments include a method of cleaning needles of a probe card in a test system includes mounting the probe card, which has a plurality of device under tests (DUTs) and needles, in a card mounting part. The DUTs and needles are scanned using a camera positioned in the test system to provide a scan result. A laser beam is focused on at least one of the needles based on the scan result and the laser beam is irradiated on the at least one of the needles to clean the at least one of the needles.

In other embodiments, the laser beam comprises a plurality of laser beams and the at least one needle comprises a plurality of needles. Focusing the laser beams includes comparing the scan result with a stored image corresponding a case where the laser beams are focused on the needles and moving the laser beams or the probe card to focus the laser beams on the needles based on the comparison of the scan result and the stored image. Irradiating the laser beams may be followed by scanning the cleaned needles using the camera to provide a cleaning result image.

In further embodiments, scanning the cleaned needles is followed by identifying ones of the needles that are not yet clean based on the cleaning result image. Focusing the laser beams and irradiating the laser beams is repeated to clean the identified ones of the needles that are not yet cleaned. Identifying ones of the needles may include displaying the cleaning result image on a monitor of the test system.

In other embodiments, scanning the DUTs and needles includes determining coordinates associated with the needles and generating a needle map based on the determined coordinates as the scan result.

In further embodiments, the scan result is an optical image of the needles captured by the camera. Scanning the DUTs and needles may include focusing the camera on a same location as the laser beams.

In other embodiments, scanning the DUTs and needles is preceded by obtaining cleaning requisition map data. The cleaning requisition map data includes information regarding coordinates of device under tests (DUTs) of the probe card. Focusing the laser beams includes focusing the laser beams based on the cleaning requisition map data and the scan result. Obtaining the cleaning requisition map data may include obtaining cleaning requisition map data for a plurality of different configuration DUTs and selecting cleaning requisition map data to be used for focusing the laser beams based on a type of probe card to be cleaned.

In yet other embodiments, a method of cleaning needles of a probe card includes preparing a test system including a monitor installed outside the test system, a stage part installed in the test system and having a camera and a laser beam irradiating part, a probe card mounting part installed in an upper portion of the test system, and a control part. A probe card having DUTs and needles is mounted on the probe card mounting part. Cleaning requisition map data is loaded in the control part. The cleaning requisition map data has information regarding coordinates of device under tests (DUTs) of the probe card. Laser beams are irradiated to the needles of the probe card using the laser beam irradiating part with reference to the cleaning requisition map data. Optical images of the needles irradiated with the laser beams are captured using the camera and a cleaning map is generated including the captured images. The needles of the probe card may be scanned using the camera and the laser beams may be focused on the needles before irradiating the needles.

In some embodiments, the cleaning requisition map data is updated to indicate DUTs irradiated with the laser beams and cleaning status map data is generated. The cleaning status map data may include the optical images of the needles irradiated with the laser beams. Before irradiating the laser beams to the needles, optical images of the needles to be irradiated with the laser beams may be captured. The optical images of the needles irradiated with the laser beams may be correlated with the optical images of the needles to be irradiated with the laser beams and a cleaning result may be determined.

In yet further embodiments, a test system is provided for testing semiconductor wafers using probe cards. The system includes a main body configured to be coupled to a wafer transfer module to receive wafers to be tested. A laser beam provider is optically coupled to the main body that generates a laser beam. A monitor is disposed outside the main body. A probe card mounting part is on the main body. A stage part is disposed inside the main body. The stage part includes a wafer chuck configured to receive a wafer from the wafer transfer module, a camera configured to scan DUTs and needles of the probe cards and a laser beam irradiating part configured to direct the laser beam from the laser beam provider on the needles of the probe cards to clean the needles. The stage part is configured to move the camera to scan the DUTs and needles and to move the laser beam irradiating part to clean the needles. The system further includes a controller configured to control the stage part to scan the DUTs and needles of the probe cards with the camera and to focus the laser beams on the needles to clean the needles. The controller is further configured to receive scanned images from the camera and to determine if the needles have been cleaned based on the received scanned images and to initiate selective re-cleaning of ones of the needles responsive to determining if the needles have been cleaned.

In other embodiments, the controller is configured to receive cleaning requisition map data including information regarding coordinates of device under tests (DUTs) of a plurality of different configuration probe cards and to select cleaning requisition map data to be used for focusing the laser beams based on a type of probe card to be cleaned.

In further embodiments, a test module is positioned on the main body above the stage part with the probe card mounting part therebetween. Test module is configured to electrically test devices on a wafer mounted on the wafer chuck using a probe card in the probe card mounting part to electrically connect to the devices on the wafer. The controller may be configured to store images captured by the camera and to display images captured by the camera on the monitor. The stage may be movable in three axial directions and the controller may be configured to correlate an image captured by the camera with a stored image corresponding to a case where the laser beams are focused on the needles to move the stage to a position wherein the image captured by the camera corresponds to the stored image.

BRIEF DESCRIPTION OF THE DRAWINGS

The foregoing and other features and advantages of the inventive concepts will be apparent from the more particular description of preferred embodiments of the inventive concepts, as illustrated in the accompanying drawings in which like reference characters refer to the same parts throughout the different views. The drawings are not necessarily to scale, emphasis instead being placed upon illustrating the principles of the inventive concepts. In the drawings.

DETAILED DESCRIPTION OF THE EMBODIMENTS

Figure 1:
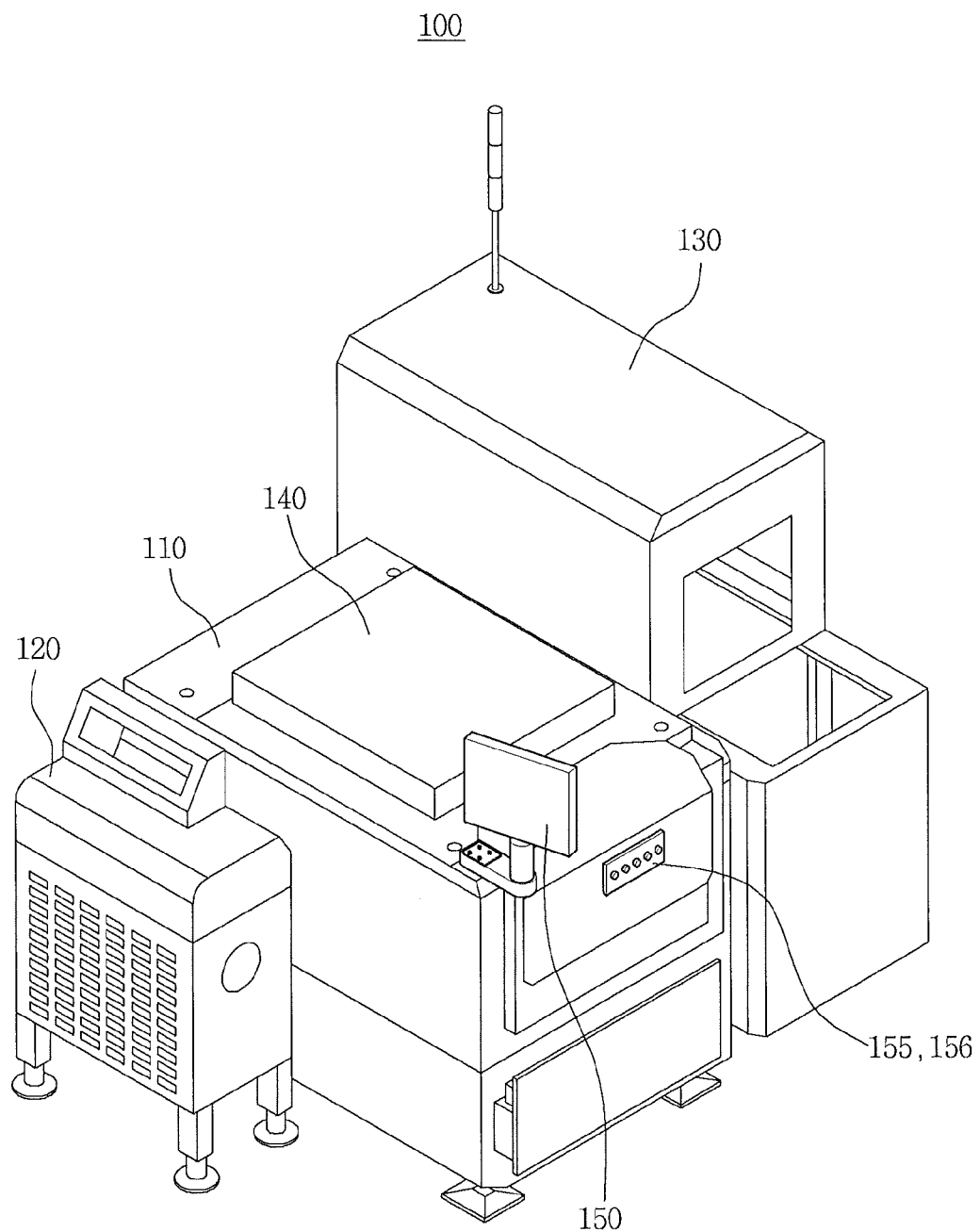
FIG. 1 is a perspective view of a test system according to some embodiments of the present inventive concept.

Advantages and features of the present inventive concept and methods of accomplishing the same may be understood more readily by reference to the following detailed description of preferred embodiments and the accompanying drawings. The present inventive concept may, however, be embodied in many different forms and should not be construed as being limited to the embodiments set forth herein. Rather, these embodiments are provided so that this disclosure will be thorough and complete and will fully convey the concept of the invention to those skilled in the art, and the present inventive concept will only be defined by the appended claims. Like reference numerals refer to like elements throughout the specification.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on", "directly connected to" or "directly coupled to" another element or layer, there are no intervening elements or layers present. Other words used to describe the relationship between elements or layers should be interpreted in a like fashion (e.g., "between" versus "directly between," "adjacent" versus "directly adjacent," "on" versus "directly on"). As used herein, the term "and/or" includes any and all combinations of one or more of the associated listed items.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present inventive concept.

Spatially relative terms, such as "beneath", "below", "lower", "above", "upper", and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

Embodiments are described herein with reference to cross-section illustrations that are schematic illustrations of idealized embodiments (and intermediate structures). As such, variations from the shapes of the illustrations as a result, for example, of manufacturing techniques and/or tolerances, are to be expected. Thus, these embodiments should not be construed as limited to the particular shapes of regions illustrated herein but are to include deviations in shapes that result, for example, from manufacturing. In the drawings, the thicknesses of layers and regions may be exaggerated for clarity. Thus, embodiments of the present inventive concept should not be construed as limited to the particular shapes of regions illustrated herein but are to include deviations in shapes that result, for example, from manufacturing. For example, right-angled etched regions may actually show rounded regions or regions having predetermined radii of curvatures. Thus, the regions illustrated in the figures are conceptual in nature and their shapes are not intended to illustrate the precise shape of a region of a device and are not intended to limit the scope of the present inventive concept.

Unless otherwise defined, all terms (including technical and scientific terms) used herein have the same meaning as commonly understood by one of ordinary skill in the art to which the present inventive concept belongs. It will be further understood that terms, such as those defined in commonly used dictionaries, should be interpreted as having a meaning that is consistent with their meaning in the context of the relevant art and this specification and will not be interpreted in an idealized or overly formal sense unless expressly so defined herein.

Like numbers refer to like elements throughout. Thus, the same or similar numbers may be described with reference to other drawings even if they are neither mentioned nor described in the corresponding drawing. Also, even elements that are not denoted by reference numbers may be described with reference to other drawings.

FIG. 1 is a perspective view of the outward appearance of a test system 100 according to some embodiments of the inventive concept. Referring to FIG. 1, the illustrated test system 100 may include a main body 110, a laser beam provider 120, and a wafer transfer module 130. The test system 100 may also include a test module 140 and a monitor 150 disposed on the main body 110.

The laser beam provider 120, which may be installed on one side surface of the main body 110, may generate laser beams and provide the laser beams into the main body 110. For example, the laser beam provider 120 may be installed outside the main body 110. When the laser beam provider 120 is installed outside the main body 110, inspection, maintenance, and replacement of the laser beam provider 120 may be easily performed. As the laser beam provider 120 may include a lamp configured to emit a high energy heat generating beam, the laser beam provider 120 may need to be inspected and maintained more frequently than the main body 110. Accordingly, when the laser beam provider 120 is installed outside the main body 110, convenience and efficiency of operations may be improved.

The wafer transfer module 130 may be disposed on another side surface of the main body 110 and provide the wafer W into the main body 110. The laser beam provider 120 and the wafer transfer module 130 may be disposed opposite each other across the main body 110 to efficiently utilize a space occupied by the test system 100, minimize the line of flow of the wafer W and an operator, and make test processing and equipment maintenance operation efficient.

The test module 140 may provide circuital environments required to test the wafer W loaded in the main body 110. The test module 140 will be described in further detail with reference to other drawings.

The monitor 150 may visually provide image information and map information regarding a probe card (see, e.g., item 190 in FIG. 3) configured to test the wafer W. A function and operation of the monitor 150 will be described later herein.

A control part 155 may be installed within the main body 110. The control part 155 may command the test system 100 to operate and control the operation of the test system 100. A function and operation of the control part 155 will be described later herein. A control panel 156 capable of communicating with the control part 155 may be installed on a front surface of the outside of the main body 110. Various manipulation buttons capable of controlling the start, operation, and termination of the test system 100 may be disposed on the control panel 156. For example, an operator may manipulate components of the control panel 156 and operate, drive, or terminate the test system 100 or transmit commands to the control part 155.

Figure 2:
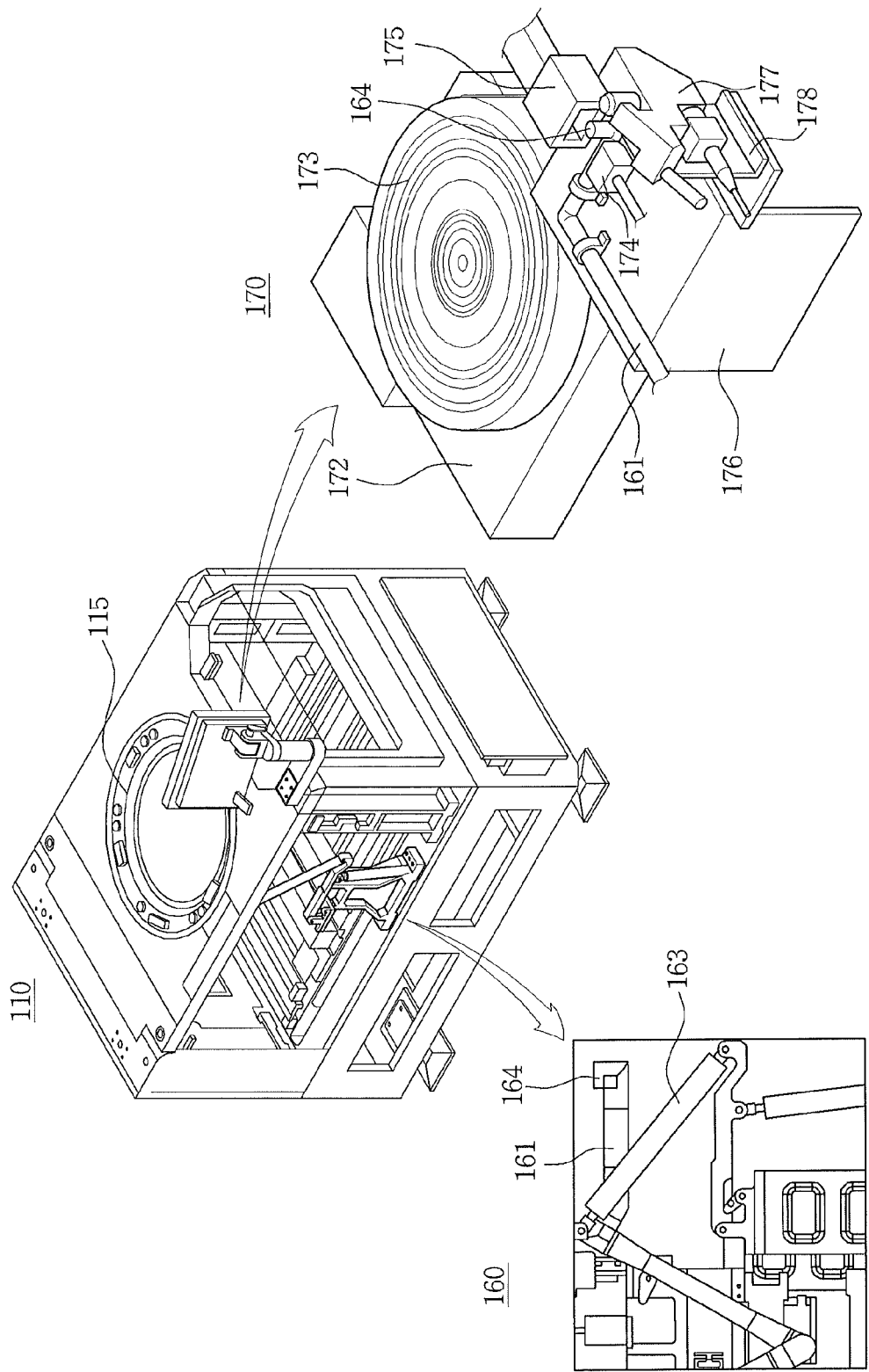
FIG. 2 is a perspective view illustrating some of the internal components included in the test system of FIG. 1 according to some embodiments.

FIG. 2 is a perspective diagram showing some of the main internal components included in the main body 110 of the test system 100 shown in FIG. 1 according to some embodiments of the inventive concept. Referring to FIG. 2, the main body 110 of the test system 100 may include a laser beam delivering part 160 and a stage part 170.

The stage part 170 may include a chuck support part 172. A wafer chuck 173 may be installed on the chuck support part 172. A ventilation port 174, an exhaust part 175, and a camera 177 may be disposed above the chuck support part 172.

The wafer chuck 173 may provide a space where the wafer W may be mounted, and support the wafer W during testing.

The ventilation port 174 may provide the flow of air. The exhaust part 175 may suck the air. For example, the air and contaminants disposed in the main body 110 may be externally exhausted through the exhaust part 175 along the flow of the air of the ventilation port 174. The exhaust part 175 may include a suction pump. The ventilation port 174 and the exhaust part 175 may be installed on an air flow support part 176. For instance, the air flow support part 176 may independently move and be disposed above the stage part 170, or move to another position.

The camera 177 may capture an image of needles of the probe card 190 (see, e.g., FIG. 3) that will be described later herein. A function and operation of the camera 177 will be described later herein as well. The camera 177 may be installed on a camera support 178. For example, the camera support 178 may be independently disposed above the stage part 170 and be movable to another position.

The laser beam delivering part 160 may include a laser beam delivering passage 161 and a control rod 163. The laser beam delivering part 160 may receive laser beams from the laser beam provider 120 and transmit the laser beams to a laser beam irradiating part 164.

The laser beam irradiating part 164 may be installed in an end portion of the laser beam delivering passage 161. The laser beam irradiating part 164 may irradiate laser beams in an upward direction. The laser beam irradiating part 164 may be disposed between the ventilation port 174 and the exhaust part 175. The control rod 163 may function to move, fix, and/or support the laser beam delivering passage 161. The laser beam delivering passage 161 and the control rod 163 may include a plurality of movable joints. The laser beam irradiating part 164 may be fixed to any one of the stage part 170, the air flow support part 176, or the camera support part 178. Accordingly, the laser beam irradiating part 164 may horizontally move or vertically move up and down with the motion of the stage part 170, the air flow support 176, or the camera support part 178.

The ventilation port 174, the exhaust part 175, and the laser beam irradiating part 164, and the camera 177 may be fixed onto the stage part 170 or be installed to be capable of independently moving.

A probe card mounting part 115 may be installed in an upper portion of the main body 110. For example, a test module 140 may be disposed on the probe card mounting part 115. The probe card mounting part 115 may have a cavity. For instance, the probe card mounting part 115 may have the form of a cavity or a manhole, and an outer arc of the probe card mounting part 115 may be formed as a staircase type. The probe card mounting part 115 will be described in further detail later herein.

Figure 3:
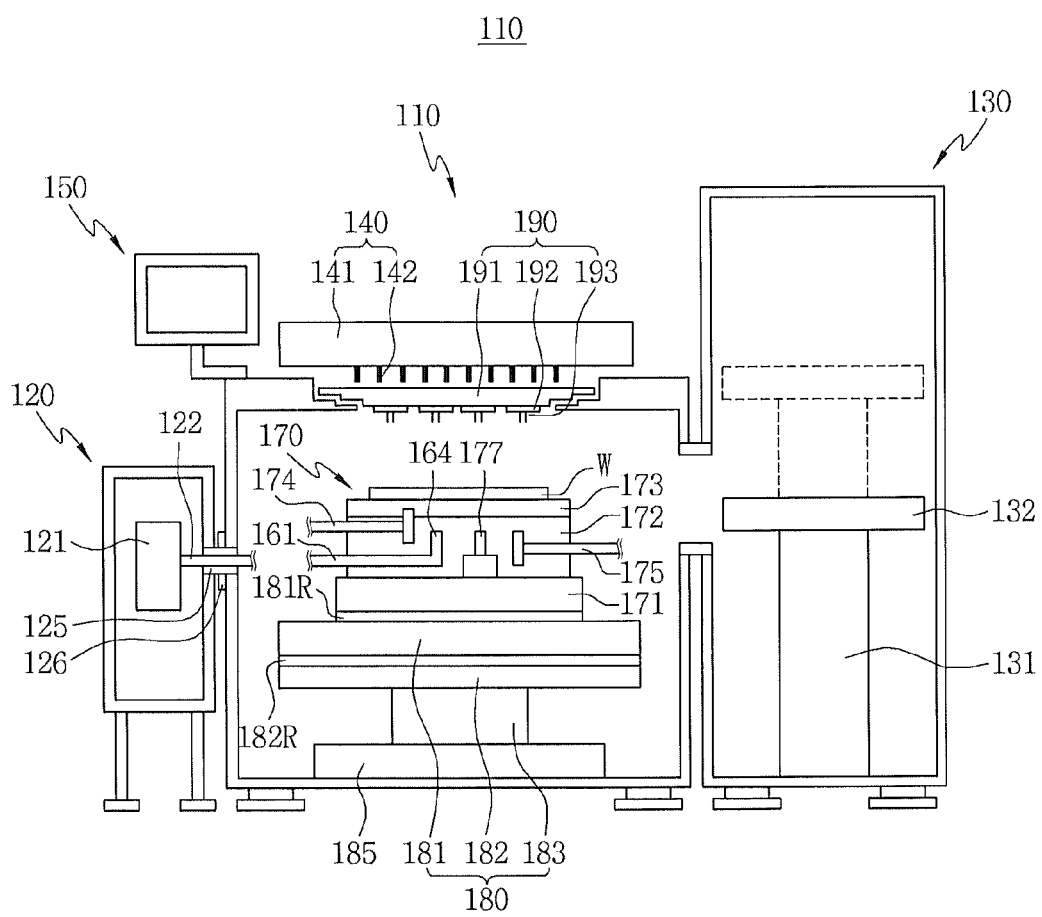
FIG. 3 is a schematic cross-sectional view of the test system shown in FIG. 1 according to some embodiments.

FIG. 3 is a schematic inner cross-sectional view of a test system 100 according to some embodiments of the inventive concept. Referring to FIG. 3, a main body 110 of the test system 100 may include a stage part 170 and a stage moving part 180, and the probe card mounting part 115 may be disposed in the upper portion of the main body 110. The stage moving part 180 may be installed on the stage support part 185.

The laser beam provider 120 may include a laser beam generating part 121 and a laser beam transmitting tube 122. Laser beams generated by the laser beam generating part 121 may be provided into the main body 110 through the laser beam transmitting tube 122. For example, the laser beams may be provided to the laser beam transmitting part 160. A space between the laser beam provider 120 and the main body 110 may be sealed using a sealant 125. Also, a sensor 126 may be attached between the laser beam provider 120 and the main body 110. The sealant 125 may hermetically seal and cut off the inside and outside of the main body 110 and/or the laser beam provider 120 and prevent leakage of the laser beams. The sensor 126 may sense a pressure or light and sense damage to the sealant 125 and/or leakage of light.

The wafer transfer module 130 may include an elevating part 131 and a table 132. The table 132 on which the wafer W is mounted may be moved up and down by the elevating part 131. The wafer W may be loaded/unloaded from the outside/inside to the inside/outside through the wafer transfer module 130.

The test module 140 may include a test head 141 and pogo pins 142. The test head 141 may include a test circuit and be in contact with the probe card 190 through the pogo pins 142 and transmit/receive electric signals to/from the probe card 190. For brevity, it is illustrated that the test module 140 is slightly lifted. Also, it is illustrated that the probe card 190 is mounted in the probe card mounting part 115.

The probe card 190 may include a card substrate 191, a plurality of devices under tests (DUTs) 192, and needles 193. Each of the DUTs 192 may have a size and shape corresponding to a semiconductor chip disposed on the wafer W. The card substrate 191 may include a printed circuit board (PCB). The needles 193 may be aligned with input/output (I/O) pads of the semiconductor chip. In the inventive concept, the DUTs 192 may not have shapes corresponding to all semiconductor chips disposed on the wafer W. For example, the DUTs 192 may be disposed to correspond to some of the semiconductor chips disposed on the wafer W. A shape of arrangement of the DUTs 192 will be described in further detail later herein.

The stage moving part 180 may include an X-axis moving part 181, a Y-axis moving part 182, and a Z-axis moving part 183. The X-axis moving part 181 and the Y-axis moving part 182 may move the stage part 170 along rails 181R and 182R extending in X- and Y-axial directions, respectively. The Z-axis moving part 182 may serve an elevation function. For example, the stage moving part 180 may support the stage part 170 and move the stage part 170 in the X-, Y-, and Z-axial directions. The positions of the X-axis moving part 181 and the Y-axis moving part 182 may be exchanged.

For instance, when each of the chuck support 172, the laser beam irradiating part 164, the exhaust part 175, and the camera 177 is fixed onto a base 171, the wafer chuck 173, the laser beam irradiating part 164, the exhaust part 175, and the camera 177 may be simultaneously moved in the X-, Y-, and Z-axial directions. Alternatively, each of the chuck support part 172, the laser beam irradiating part 175, and the camera 177 may not be fixed onto the base 171 but be disposed to be capable of independently moving. For clarity, the air flow support part 176 and the camera support part 178 of FIG. 2 are omitted from FIG. 3.

The laser beam irradiating part 164 may variously change an irradiation direction using an additional driving apparatus. In the drawings, it is assumed that an irradiation direction of the laser beam irradiating part 164 is fixed. When the irradiation direction of the laser beam irradiating part 164 is fixed, laser beams may be irradiated to various locations using the X-axis moving part 181, the Y-axis moving part 182, and the Z-axis moving part 183. For example, the ventilation port 174 may be disposed on the base 171 and provoke the flow of the air, while the exhaust part 175 may be disposed on the base 171 and suck the flow of the air.

The camera 177 may capture an image of the needles 193 of the probe card 190 and transmit the captured image to the control part 155 or the monitor 150. The control part 155 may include an image processor. The control part 155 may correlate a stored image with the image received from the camera 177 and issue various commands based on the correlation result. For example, the control part 155 may issue a driving command to the X-axis moving part 181, the Y-axis moving part 182, and the Z-axis moving part 183, command the laser beam provider 120 or the laser beam irradiating part 164 to irradiate laser beams, or issue a command to unload the wafer W. Also, the control part 155 may store the image received from the camera 177 or store coordinates of the image captured by the camera 177. For example, the control part 155 may generate image data or generate map data including coordinates and/or images of the DUTs 192 and/or the needles 193. The control part 155 may include an additional memory device or communicate data with an additional server system.

Figure 4A:
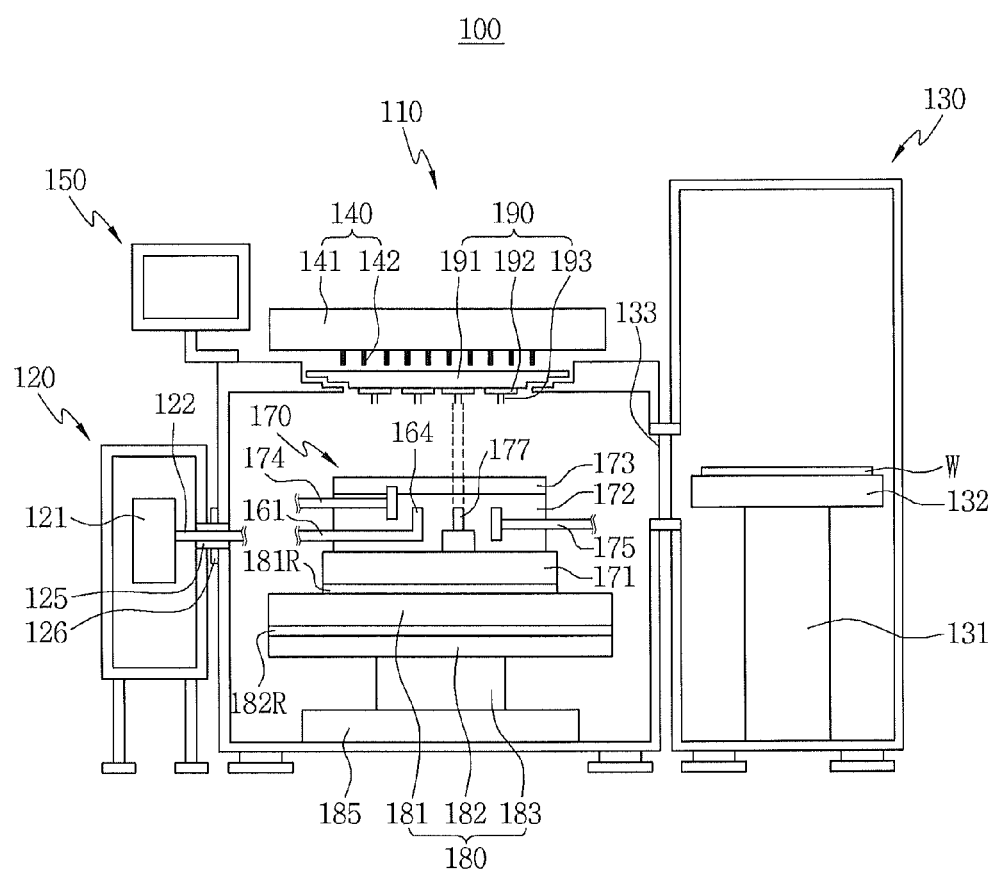
FIG. 4A is a schematic diagram illustrating a process of scanning a probe card using a camera in the test system shown in FIG. 1 according to some embodiments.

FIG. 4A is a schematic diagram illustrating a process of scanning the probe card 190 using the camera 177 in the test system 100 according to some embodiments of the inventive concept. Referring to FIG. 4A, the process of scanning the probe card 190 may include loading the probe card 190 in the test system 100 and scanning the probe card 190 using the camera 177 to capture images of the DUTs 192 and/or needles 193 of the probe card 190. The camera 177 may optically recognize the images of the DUTs 192 and/or needles 193 of the probe card 190 and convert the optical images into digital data. The scanning of the probe card 190 using the camera 177 may include moving the stage part 180 in the X- and Y-axis directions using the stage moving part 180. The images captured by the camera 177 may be transmitted to the control part 155. The control part 155 may correlate the images received from the camera 177 with stored images and stores coordinates of a location where both the correlated images are consistent. For example, map data in which the coordinates of the DUTs 192 or needles 193 of the probe card 190 are written, may be generated. The map data may include a DUT map including the coordinates and image of the DUTs 192 and/or a needle map including the coordinates and image of the needles 193. As an example, the image of the DUTs 192 of the probe card 190 captured by the camera 177 is displayed on the monitor 150. The wafer W may not be mounted on the wafer chuck 173. For instance, the wafer W may not be provided in the test system 100 but may be mounted on the table 132 of the wafer transfer module 130. The inside of the main body 110 may be cut off from the wafer transfer module 130 by a door 133.

Figure 4B:
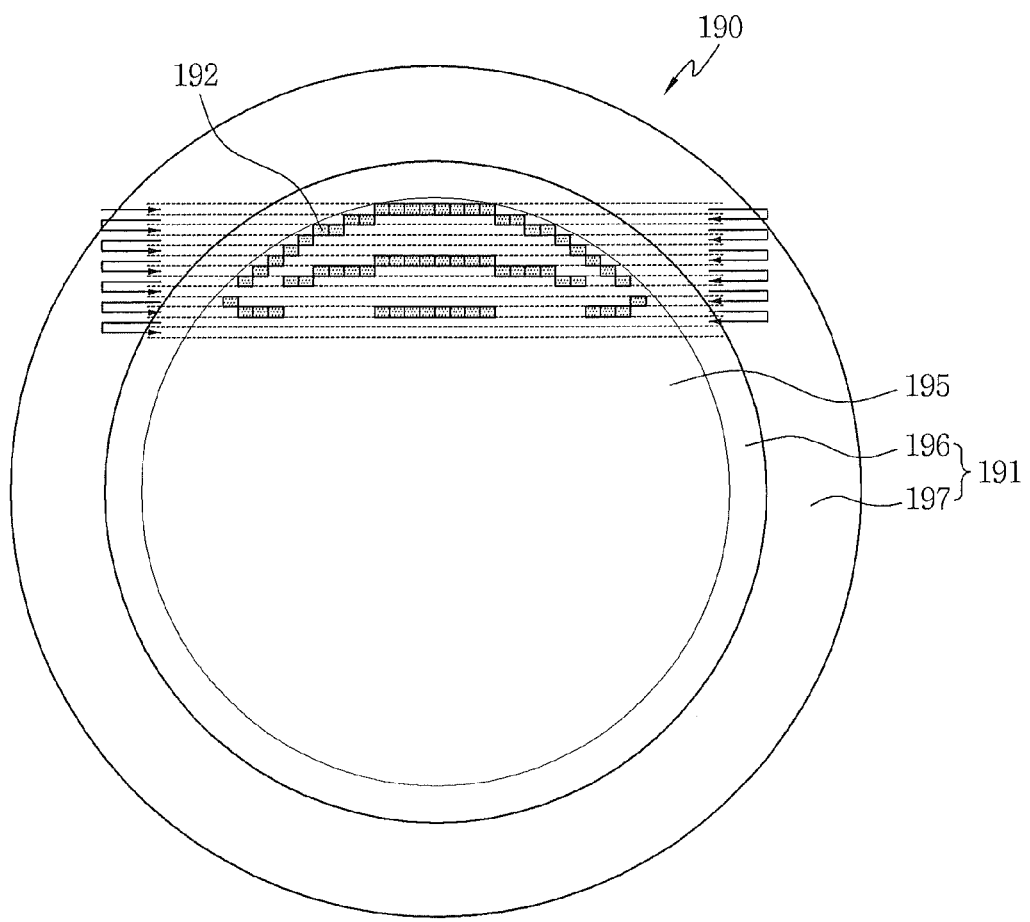
FIG. 4B is a schematic diagram of a line of flow along which a camera scans a probe card according to some embodiments.

FIG. 4B is a schematic diagram of a line of flow along which the camera 177 scans the probe card 190. Referring to FIG. 4B, the camera 177 may divide a DUT region 195 of the probe card 190 into a plurality of grids or stripes to scan the probe card 190. For example, the camera 177 may scan the DUT region 195 of the probe card 190 in units of a plurality of blocks or segments as a zigzag type. In FIG. 4B, arrows denote the line of flow along which the camera 177 scans. Alternatively, the arrows may denote the line of flow along which the camera 177 or the stage part 170 moves. The probe card 190 may include a card holder 196 surrounding the DUT region 195 and an outermost cylindrical ring 197. The card holder 196 and the cylindrical ring 197 may be in contact with the probe card mounting part 115 and may be part of the substrate 191.

Figure 4C:
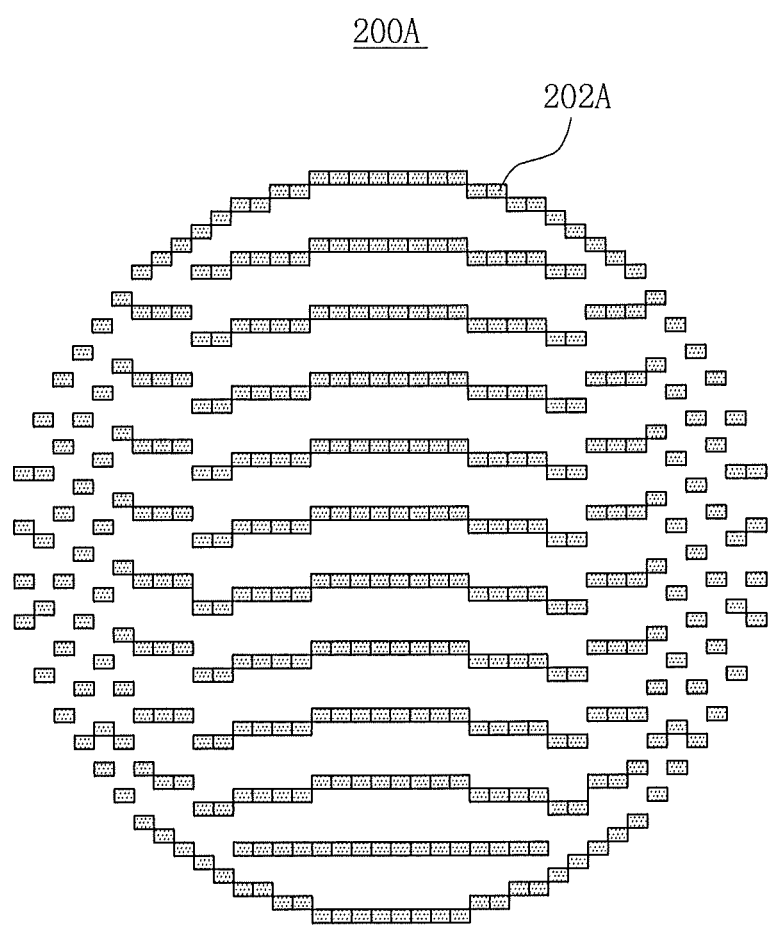
FIG. 4C is a schematic diagram of map data generated by scanning a probe card according to some embodiments.

FIG. 4C is a schematic diagram of a DUT map 200A of the map data generated by scanning the probe card 190. Referring to FIG. 4C, by scanning the probe card 190 using the camera 177, the control part 155 may generate the DUT map 200A configured to display the shapes and positions of DUTs 202A, The DUTs 202A of the probe card 190 may be arranged in a different shape from the arrangement of semiconductor chips disposed on a wafer W. For example, as can be seen from FIG. 4C, the probe card 190 may have the arrangement of the DUTs 202A corresponding to some of the semiconductor chips disposed on the wafer W. For reference, the arrangement of the DUTs 202A shown in FIG. 4C may be referred to as a rainbow shape. According to the inventive concept, the control part 155 may generate the DUT map 200A or map data of the probe cards 190 having the DUTs 202A arranged in various shapes.

Figure 4D:
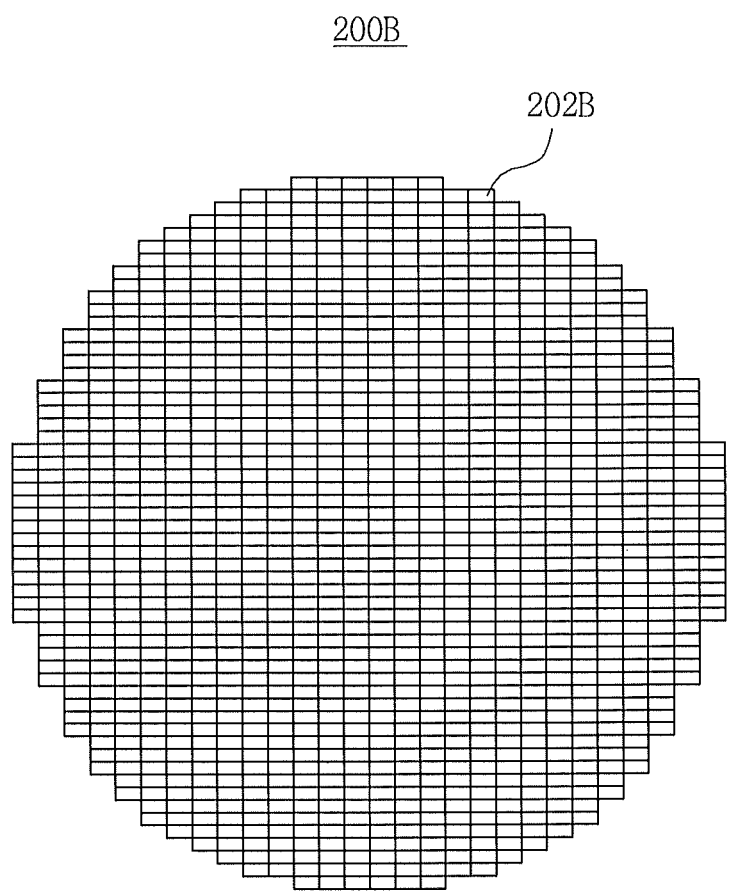
FIGS. 4D and 4E are schematic diagrams of map data generated by scanning probe cards having device under tests (DUTs) arranged in different shapes according to some embodiments.
Figure 4E:
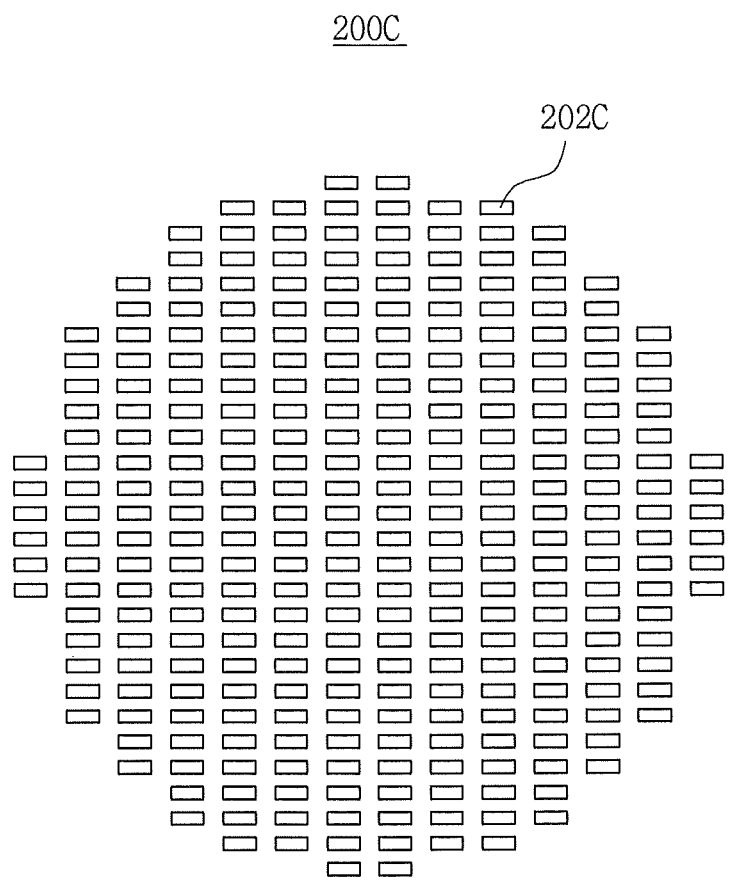

FIGS. 4D and 4E are schematic diagrams of DUT maps 200B and 200C having DUTs 202B and 202C arranged in different shapes/patterns. For instance, the DUT map 200B may have the DUTs 202B arranged in substantially the same shape as the arrangement of semiconductor chips disposed on a wafer W. Alternatively, the DUT map 200C may have the DUTs 202C arranged in various other shapes. Accordingly, referring to FIGS. 4D and 4E, the probe cards 190 may have the DUTs 192 arranged in various shapes/patterns so that the DUT maps 200B and 200C having various shapes may be generated.

Referring back to FIGS. 4A through 4E, a method of generating map data according to some embodiments of the inventive concept may include directly scanning all the probe cards 190 to generate map data of each of the probe cards 190. For instance, even if the control part 155 does not have information regarding the arrangement of the DUTs 192 of each of the probe cards 190, the DUT maps 200A, 200B, and 200C may be directly generated so that a semiconductor fabrication process may be performed without interruption.

Figure 5:
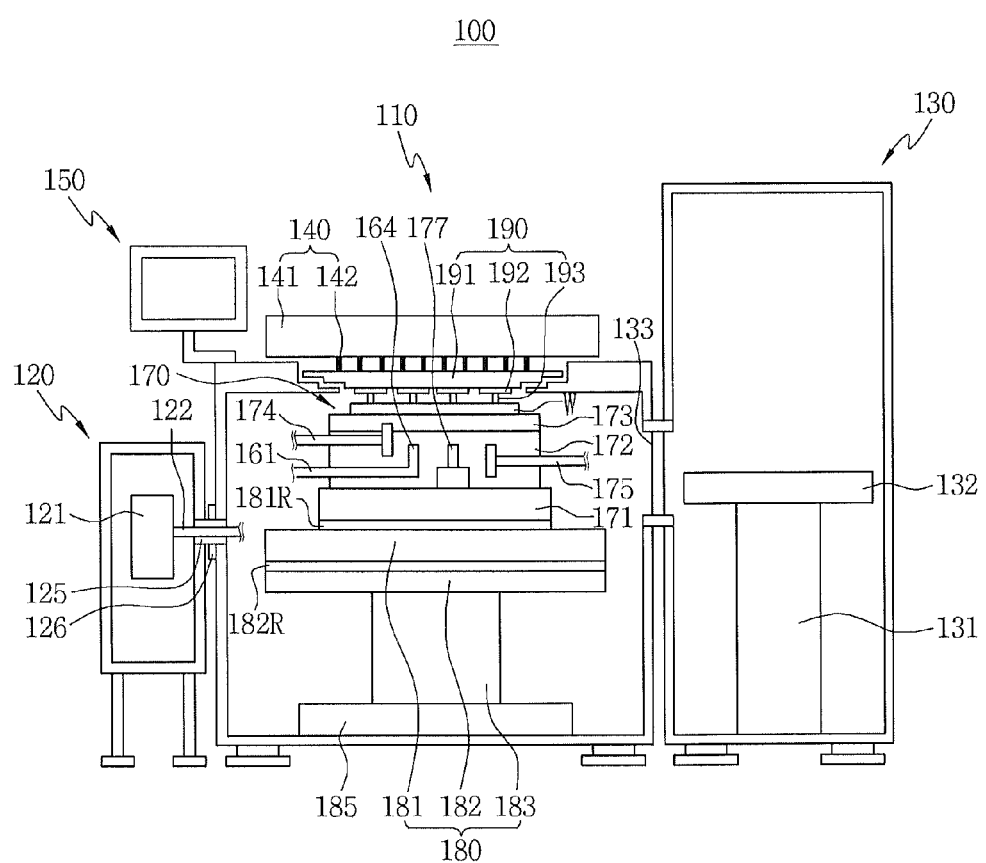
FIG. 5 is a schematic diagram illustrating a method of testing a wafer according to further embodiments of the inventive concept.

FIG. 5 is a schematic diagram illustrating a method of testing a wafer W according to some embodiments of the inventive concept. Referring to FIG. 5, a method of testing the wafer W using the test system 100 may include performing a test process by physically bringing respective needles 193 of the probe card 190 into contact with input/output (I/O) pads of a plurality of semiconductor chips disposed on the wafer W. The pogo pins 142 of the test module 140 may be in contact with the probe card 190. For example, the pogo pins 142 may be physically and electrically in contact with pogo pads disposed on a surface of the probe card 190. The pogo pads are omitted in the drawings for clarity. When the needles 193 of the probe card 190 are arranged as shown in FIG. 4C, the test process may be performed while moving the stage part 170 in an X-, Y-, and/or Z-axial directions. The stage part 170 may be moved by the stage moving part 180 in response to commands issued by the control part 155. The control part 155 may analyze map data and issue motion commands to the stage moving part 180. For instance, when the DUTs 192 of the probe card 190 are arranged as shown in FIG. 4C, the wafer W may be moved by the stage moving part 180 in a step-and-repeat manner and tested. The step-and-repeat manner may refer to a moving method including a repetition of motions and stops.

Figure 6A:
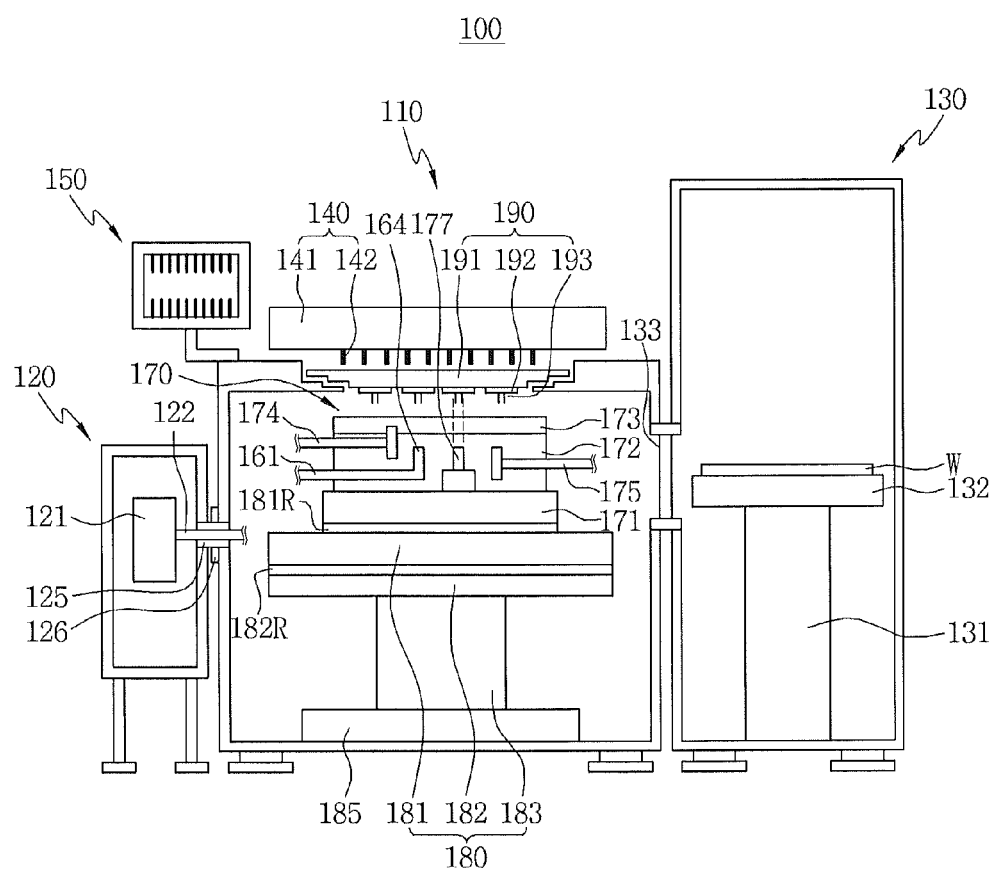
FIGS. 6A through 6C are schematic diagrams illustrating a process of cleaning needles of a probe card according to some embodiments of the inventive concept.
Figure 6B:
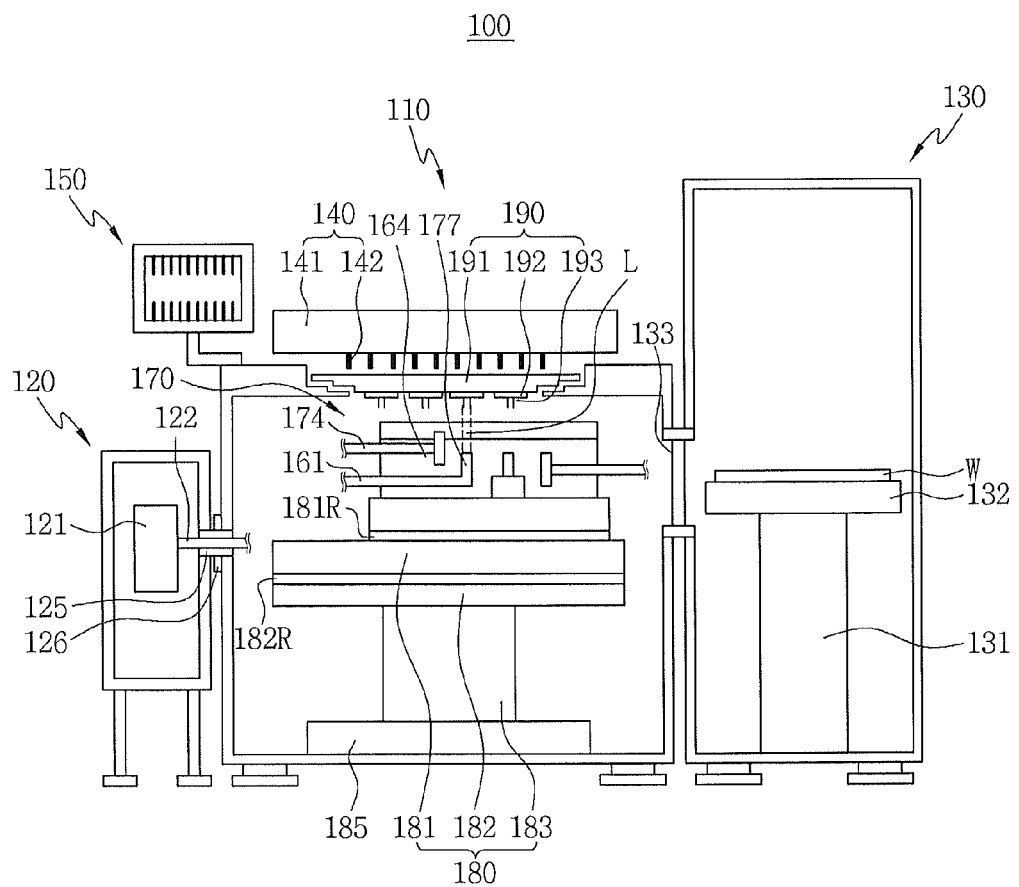
Figure 6C:
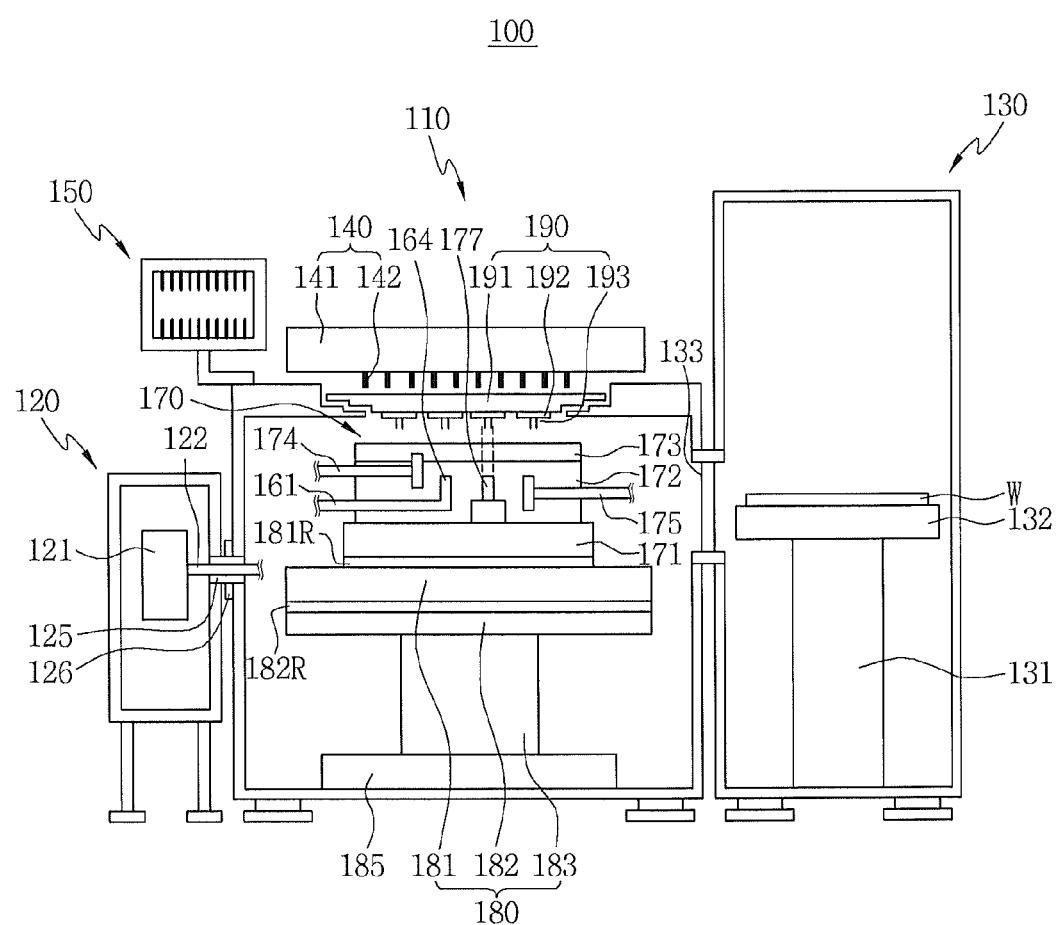

FIGS. 6A through 6C are schematic diagrams illustrating a process of cleaning needles 193 of a probe card 190 according to some embodiments of the inventive concept. Referring to FIG. 6A, the process of cleaning the needles 193 of the probe card 190 may include auto-focusing on the needles 193 of the probe card 190 using the camera 177 such that laser beams are focused on the needles 193 of the probe card 190. In the inventive concept, a focus of the camera 177 may be equalized to a focus of the laser beams. For example, the stage part 170 may move in the X- and Y-axial directions based on map data of the needles 193 of the probe card 190 such that the needles 193 of the probe card 190 are disposed in a position to be irradiated with the laser beams. Thereafter, the camera 177 may capture an image of needles 193 to be cleaned/cleaned, among the needles 193 of the probe card 190, and transmit the captured image to the control part 155. The control part 155 may correlate a stored image of the needles 193 of the probe card 190 with the received image of the needles 193 of the probe card 190, and transmit a command to move the stage part 170 such that laser beams are focused on the needles, to the stage moving part 180. For example, the Z-axis moving part 183 of the stage moving part 180 may move up or down the stage part 170, and adjust the position of the needles 193 such that the laser beams are focused on the needles 193 to be cleaned. In this case, the camera 17 may capture an image of the needles 193, which are not cleaned yet, and transmit the captured image to the control part 155. Accordingly, the control part 155 may generate pre-cleaning image data including received images of the needles 193 of the probe card 190. The image of the needles 193 captured before the needles 193 are cleaned may be displayed on the monitor 150.

Referring to FIG. 6B, the process of cleaning the needles 193 of the probe card 190 according to some embodiments of the inventive concept may include irradiating laser beams L to the needles 193 of the probe card 190. The laser beams L may be irradiated to the needles 193 using a neodymium (Nd): yttrium aluminum garnet (YAG), solid laser at an output of about 350 mJ to about 800 mJ and a wavelength of about 532 nm to about 1064 nm to a spot size of about 3.0 mm to about 12.0 mm. Accordingly, the laser beams L may be simultaneously irradiated to a plurality of needles 193. The laser beams L may be irradiated to the needles 193 by moving the stage part 170 or the laser beam irradiating part 164. In FIG. 6B, it is assumed that the stage part 170 is moved.

Referring to FIG. 6C, the process of cleaning the needles 193 of the probe card 190 according to embodiments of the inventive concept may include capturing an image of the cleaned needles 193 of the probe card 190 using the camera 177. The captured image may be transmitted to the control part 155. The control part 155 may generate post-cleaning image data including received images of the needles 193 of the probe card 190. The image of the cleaned needles 193 may be displayed on the monitor 150. Subsequently, the process of cleaning the needles 193 of the probe card 190 according to some embodiments of the inventive concept may include precisely correlating the image of the needles 193 to be cleaned with the image of the cleaned needles 193.

Figure 6D:
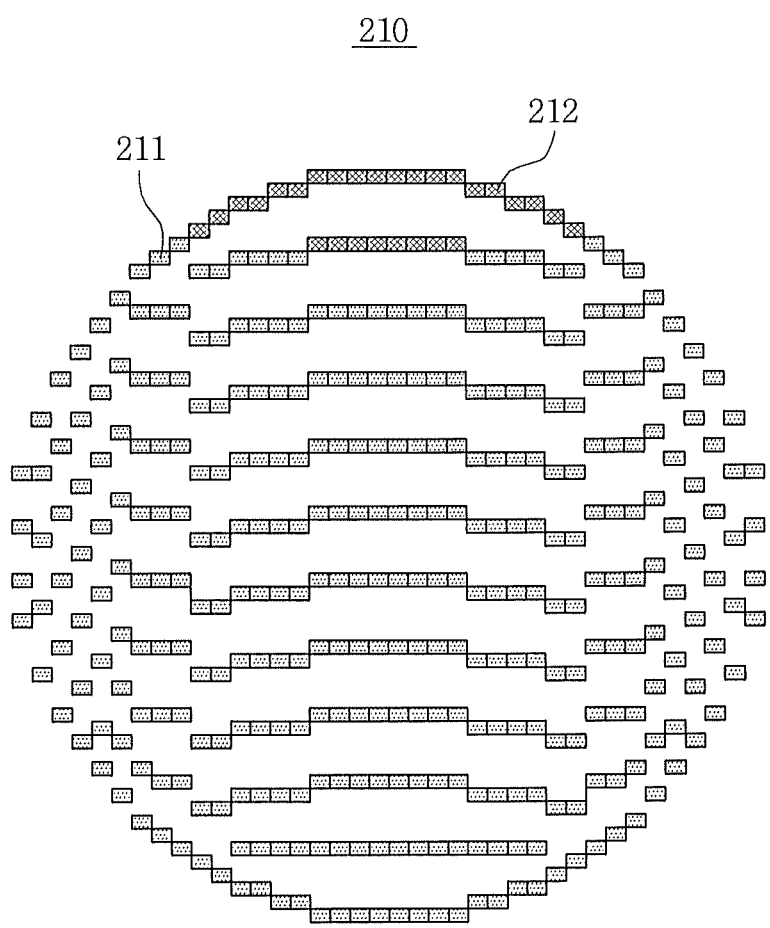
FIG. 6D is an exemplary schematic diagram showing the display of a DUT map, which is updated in real-time using a blanket cleaning method, on a monitor according to some embodiments.

The process of cleaning of the needles 193 of the probe card 190 according to some embodiments of the inventive concept may be applied using a blanket cleaning method and a selective cleaning method. For example, when the needles 193 of the probe card 190 are cleaned using the blanket cleaning method, after the needles 193 are cleaned, the cleaning process may include regarding the cleaning of the corresponding DUTs 192 as completed. In the blanket-cleaning method, the control part 155 may determine that the cleaning of the DUTs 192 using the DUT map is completed, and update the corresponding DUT map in real-time. In this case, the DUT map updated in real-time may be displayed on the monitor 150. For example, the cleaned DUTs 192 may assume different colors, have different hatching, or indicated to be visually distinguishable. FIG. 6D is an exemplary diagram showing the display of a DUT map, which is updated in real-time using the blanket-cleaning method, on the monitor 150. Referring to FIG. 6D, the DUT map may include uncleaned DUTs 192 and cleaned DUTs 192. The cleaned DUTs 192 may be indicated by a different color from the DUTs 192 to be cleaned to make a comparison between the already cleaned and to be cleaned DUTs 192. In FIG. 6D, hatchings are added to clarify the difference between the cleaned DUTs 192 and the DUTs 192 to be cleaned. For example, item 211 may refer to the hatching for an uncleaned DUT 192 while item 212 may refer to the hatching for a cleaned DUT 192.

Figure 6E:
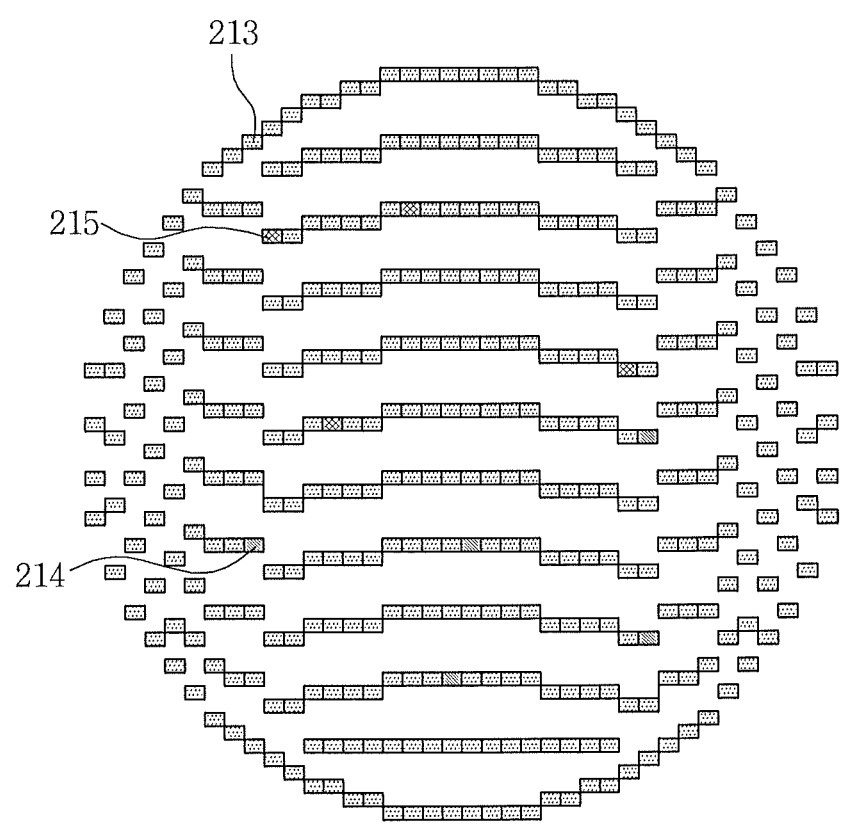
FIG. 6E is an exemplary schematic diagram that illustrates that the DUT map updated in real-time is displayed on the monitor in the case of the selective cleaning method according to some embodiments.

When the needles 193 of the probe card 190 are cleaned using the selective cleaning method, the DUTs 192 may be indicated in different manners. FIG. 6E exemplarily illustrates that the DUT map updated in real-time is displayed on the monitor 150 in the case of the selective cleaning method. Referring to FIG. 6E, the DUT map may include DUTs 213, which are not to be cleaned, DUTs 214 to be cleaned, and cleaned DUTs 215.

Figure 7A:
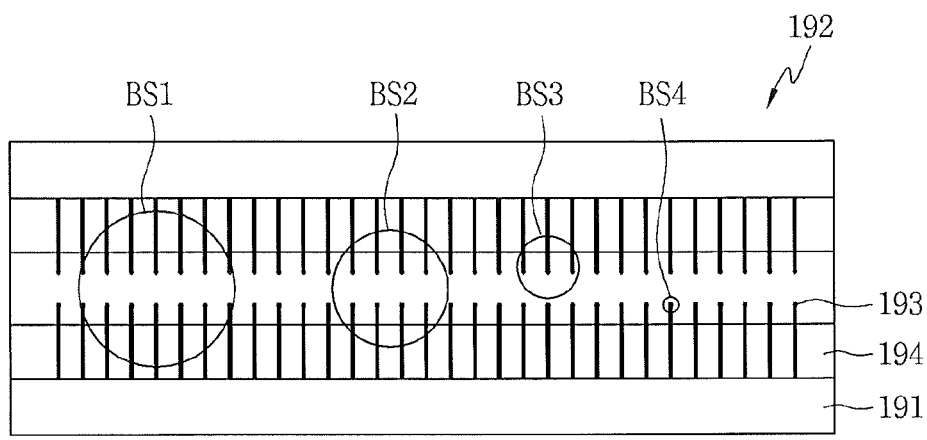
FIGS. 7A and 7B are, respectively, schematic top and lateral views of one DUT of a probe card, according to embodiments of the inventive concept.
Figure 7B:
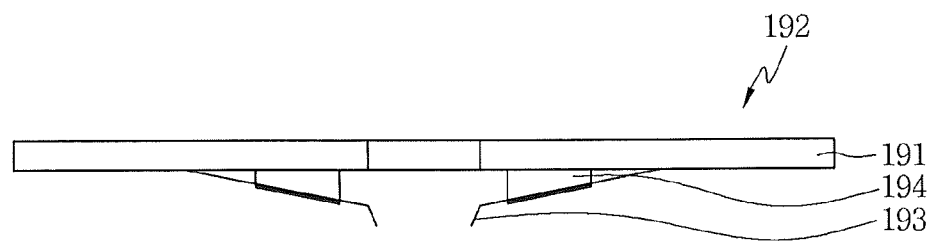

FIGS. 7A and 7B are, respectively, schematic top and lateral views of one DUT 192 of the probe card 190, according to some embodiments of the inventive concept. Referring to FIG. 7A, a plurality of needles 193 may be arranged in one DUT 192. As an example, the plurality of needles 193 may be arranged in two rows. In a cleaning method according to embodiments of the inventive concept, various beam sizes BS1, BS2, BS3, and BS4 of laser beams used to clean the needles 193 are indicated. For example, the laser beams having the various beam sizes BS1, BS2, BS3, and BS4 may be simultaneously irradiated to the plurality of needles 193 or irradiated to only one needle thereof.

Referring to FIG. 7B, the DUT 192 may include needles 193 disposed on a card substrate 191 to have elasticity, and the needles 193 may be fixed to a fixing part 194 formed of a ceramic material. The card substrate 191 may include a PCB and include conductive components, such as interconnections, vias, or pads, to electrically connect the needles 193 and the pogo pins 142.

Figure 8:
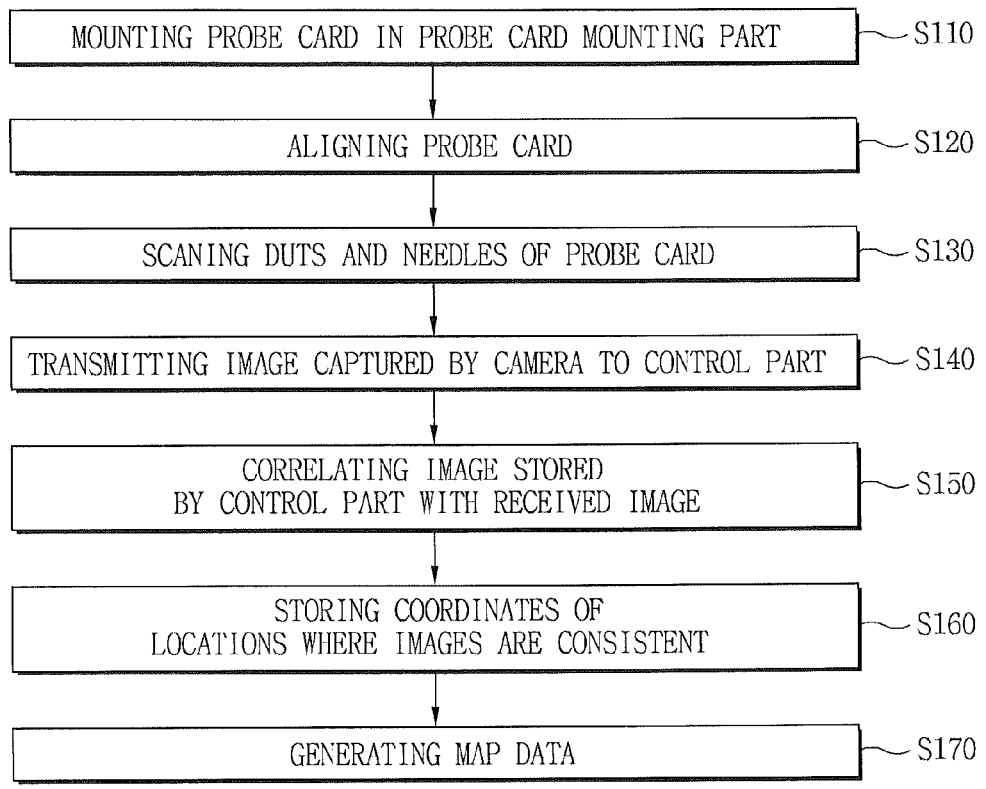
FIG. 8 is a flowchart illustrating a method of generating map data of DUTs or needles of a probe card according to embodiments of the inventive concept.

FIG. 8 is a flowchart illustrating a method of generating map data of the DUTs 192 or the needles 193 of the probe card 190 according to some embodiments of the inventive concept.

Referring to FIG. 8, the method of generating map data of the probe card 190 according to some embodiments of the inventive concept may include mounting the probe card 190 in a probe card mounting part 115 (operation S110).

Thereafter, the method of generating the map data of the probe card 190 according to some embodiments of the inventive concept may include aligning the probe card 190 (operation S120). The alignment of the probe card 190 may include correcting an azimuth angle of the probe card 190 and leveling the probe card 190. The correction of the azimuth angle of the probe card may include correcting a value θ of the probe card 190 in a reference direction, for example, into a state where an error is 0 (zero). The leveling of the probe card 190 may include horizontally adjusting the probe card 190.

Thereafter, the method of generating the map data of the probe card 190 according to some embodiments of the inventive concept may include scanning the DUTs 192 and the needles 193 of the probe card 190 using the camera 177 (operation S130). The scanning of the DUTs 192 and the needles 193 of the probe card 190 using the camera 177 may include capturing optical images of the DUTs 192 and the needles 193 of the probe card 190 using the camera 177. The scanning of the DUTs 192 and the needles 193 of the probe card 190 using the camera 177 will be understood with further reference to FIGS. 4A through 4C.

Thereafter, the method of generating the map data of the probe card 190 according to some embodiments of the inventive concept may include transmitting the optical images of the DUTs 192 and the needles 193 of the probe card 190, which are captured by the camera 177, to the control part 155 (operation S140). In this case, the optical images of the DUTs 192 and the needles 193 of the probe card 190 may be converted into digital images and transmitted to the control part 155. Accordingly, the camera 177 may have a photoelectric conversion function. For instance, the capturing of the optical images of the DUTs 192 and the needles 193 of the probe card 190, the converting of the captured images into the digital images, and the transmitting of the converted digital images to the control part 155 may be performed in real-time, in succession, and/or simultaneously.

Subsequently, the method of generating the map data of the probe card 190 according to some embodiments of the inventive concept may include correlating, by the control part 155, the images of the DUTs 192 and the needles 193, which are received from the camera 177, with stored images of the DUTs 192 and the needles 193 of the probe card 190 (operation S150).

Thereafter, the method of generating the map data of the probe card 190 according to the embodiments of the inventive concept may include storing coordinates of locations where the stored images are equal to the received images in the control part 155 (operation S160).

Next, the method of generating the map data of the probe card 190 according to some embodiments of the inventive concept may include generating the map data by collecting the stored coordinates (operation S170).

The map data may include images of the DUTs 192 and the needles 193 of the probe card 190 corresponding to the respective coordinates. For example, the map data may include coordinate map data and image map data. Accordingly, the method of generating the map data of the probe card 190 according to some embodiments of the inventive concept may include generating each of the coordinate map data and image map data of the DUTs 192 of the probe card 190, and the coordinate map data and image map data of the needles 193 of the probe card 190 and/or integrated map data thereof. When the scanning process is ended, the coordinate map data and/or image map data of the DUTs 192 and/or the needles 193 of the probe card 190 may be completed.

Figure 9:
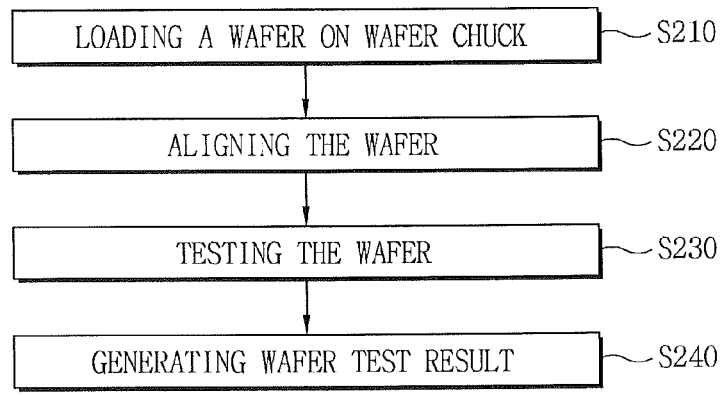
FIG. 9 is a flowchart illustrating a method of testing a wafer according to embodiments of the inventive concept.

FIG. 9 is a flowchart illustrating a method of testing a wafer W according to embodiments of the inventive concept.

Referring to FIG. 9, the method of testing the wafer W according to some embodiments of the inventive concept may include loading the wafer W on the wafer chuck 173 (operation S210).

Thereafter, the method of testing the wafer W according to some embodiments of the inventive concept may include aligning the wafer W (operation S220). The alignment of the wafer W may include moving the stage part 170 in X-, Y-, and Z-axial directions. The alignment of the wafer W may include aligning semiconductor chips disposed on a wafer W, which are to be firstly tested, with the DUTs 192 of the probe card 190. When a plurality of semiconductor chips are simultaneously tested, the alignment of the wafer W may include aligning the plurality of semiconductor chips to be firstly tested with the DUTs 192 of the probe card 190. The alignment of the semiconductor chips with the DUTs 192 of the probe card 190 may include aligning I/O pads of the semiconductor chips with the needles 193 of the probe card 190.

Thereafter, the method of testing the wafer W according to some embodiments of the inventive concept may include testing the wafer W based on the map data stored in the control part 155 (operation S230). The testing of the wafer W may include moving the stage part 170 up and down to physically bringing the I/O pads of the semiconductor chips into contact with the needles 193 of the probe card 190. After one test process is performed and the stage part 170 is moved down to physically separate the I/O pads of the semiconductor chips from the needles 193 of the probe card 190, the testing of the wafer W may include moving the stage part 170 in the X- and Y-axial directions based on the map data. For example, the stage part 170 may be moved to align semiconductor chips to be tested subsequently with the needles 193 of the probe card 190.

Thereafter, by moving the stage part 170 upward to physically bringing the I/O pads of the semiconductor chips into contact with the needles 193 of the probe card 190, a test process may be performed again. The test process may include transmitting electrical signals from the test head 141 through the pogo pin 142 and the needles 193 to the I/O pads of the semiconductor chips.

Subsequently, the method of testing the wafer W according to some embodiments of the inventive concept may include generating a wafer test result (operation S240).

Figure 10A:
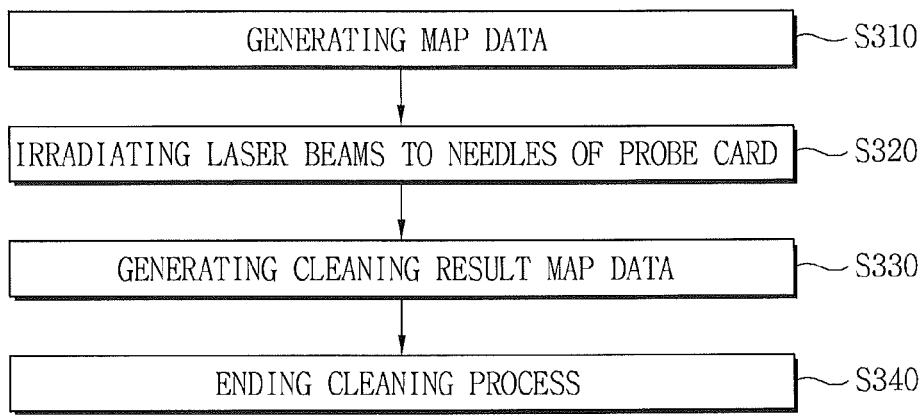
FIGS. 10A through 10D are flowcharts illustrating methods of blanket-cleaning needles of a probe card according to various embodiments of the inventive concept.

FIG. 10A is a flowchart illustrating a method of blanket-cleaning the needles 193 of the probe card 190 according to some embodiments of the inventive concept. To begin with, a cleaning method performed in a case where the map data of the DUTs 192 and the needles 193 of the probe card 190 are not stored in the control part 155 will be described.

Referring to FIG. 10A, the method of blanket-cleaning the needles 193 of the probe card 190 according to some embodiments of the inventive concept may include generating map data of the probe card 190 (as described in the embodiments of FIG. 8) (operation S310). When the map data of the probe card 190 is already stored in the control part 155, the above-described operation may be omitted.

Next, the method of blanket-cleaning the needles 193 of the probe card 190 may include irradiating laser beams to the needles 193 of the probe card 190 based on the map data (operation S320). For instance, the method of blanket-cleaning the needles 193 of the probe card 190 may include irradiating laser beams to all the needles 193 of the probe card 190. The irradiation of the laser beams to the needles 193 of the probe card 190 will be understood with further reference to FIG. 7A. The irradiation of the laser beams to the needles 193 of the probe card 190 may include moving the stage part 170 in a step-and-repeat manner. Alternatively, the irradiation of the laser beams may include irradiating laser beams in the form of a plurality of spots while continuously moving the stage part 170.

In addition, the method of blanket-cleaning the needles 193 of the probe card 190 according to some embodiments of the inventive concept may include generating cleaning result map data after cleaning all the needles 193 (operation S330). After the laser beams are irradiated to all the DUTs 192 and/or all the needles 193, the cleaning process may be ended, and the next process may be performed (operation S340).

Figure 10B:
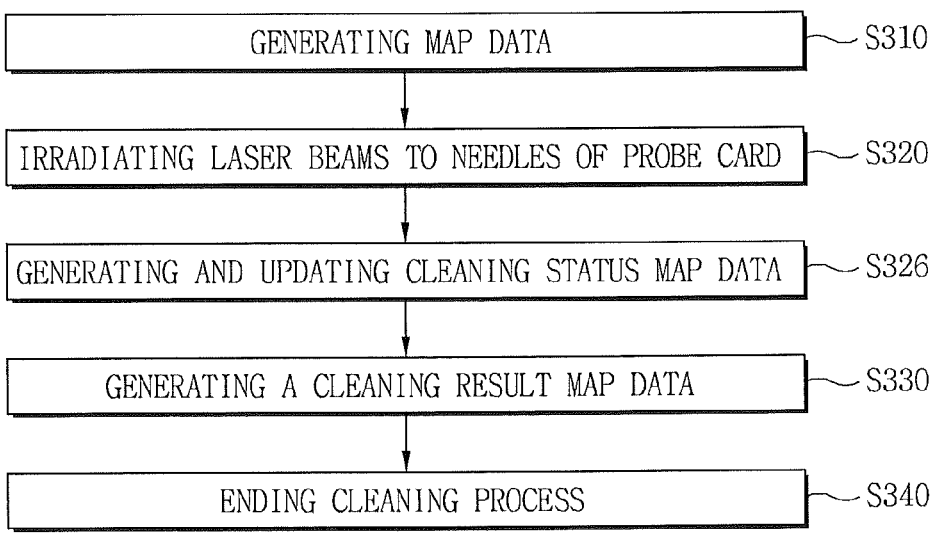

FIG. 10B is a flowchart illustrating a method of blanket-cleaning the needles 193 of the probe card 190 according to embodiments of the inventive concept. Referring to FIG. 10B, the method of blanket-cleaning the needles 193 of the probe card 190 may further include generating and updating, by the control part 155, cleaning status map data of the probe card 190 directly after irradiating the laser beams to the DUTs 192 and/or the needles 193 of the probe card 190 (operation S326). For example, the blanket-cleaning method may include generating and updating the cleaning status map data by which the DUTs 192 of the probe card 190, which are cleaned with laser beam irradiation, may be distinguished from the DUTs 192 of the probe card 190, which are not cleaned yet. The cleaning status map data will be understood with reference to FIG. 6D. For instance, the cleaning status map data may include the DUT map. In addition, the cleaning status map data may be displayed on the monitor 150 of the test system 100.

Figure 10C:
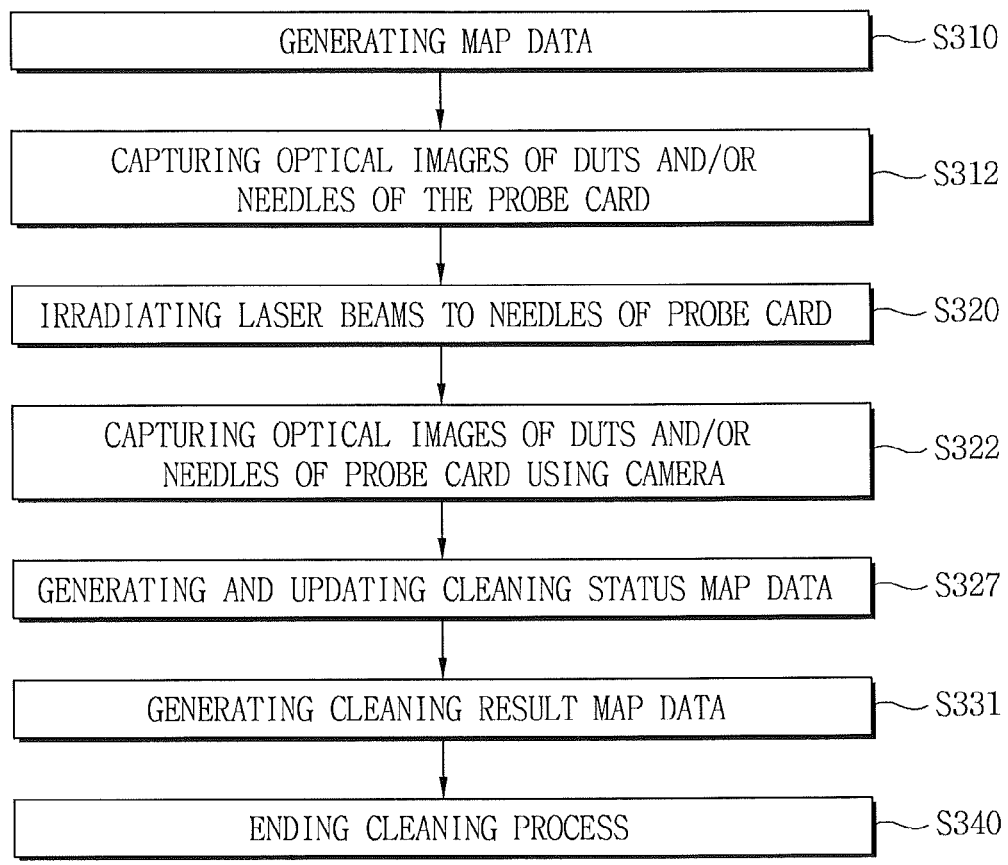

FIG. 10C is a flowchart illustrating a method of blanket-cleaning the needles 193 of the probe card 190 according to embodiments of the inventive concept. The method of blanket-cleaning the needles 193 of the probe card 190 may further include capturing optical images of the DUTs 192 and/or needles 193 of the probe card 190 using the camera 177 directly after irradiating laser beams to the DUTs 192 and/or the needles 193 of the probe card 190 (operation S322). The optical images captured by the camera 177 may be converted into digital images and transmitted to the control part 155. The control part 155 may combine the received digital images with the map data and generate and update the cleaning status map data in real-time (operation S327).

Thereafter, the method of blanket-cleaning the needles 193 of the probe card 190 according to some embodiments of the inventive concept may include generating cleaning result map data after cleaning all the needles 193 (operation S331). The cleaning result map data may be generated by updating the cleaning status map data. Accordingly, the cleaning result map data may include images of the cleaned needles 193. In some embodiments, immediately before irradiating laser beams to the DUTs 192 and/or needles 193 of the probe card 190, the method of blanket-cleaning the needles 193 of the probe card 190 may further include capturing optical images of the DUTs 192 and/or needles 193 of the probe card 190 using the camera 177 (operation S312).

Figure 10D:
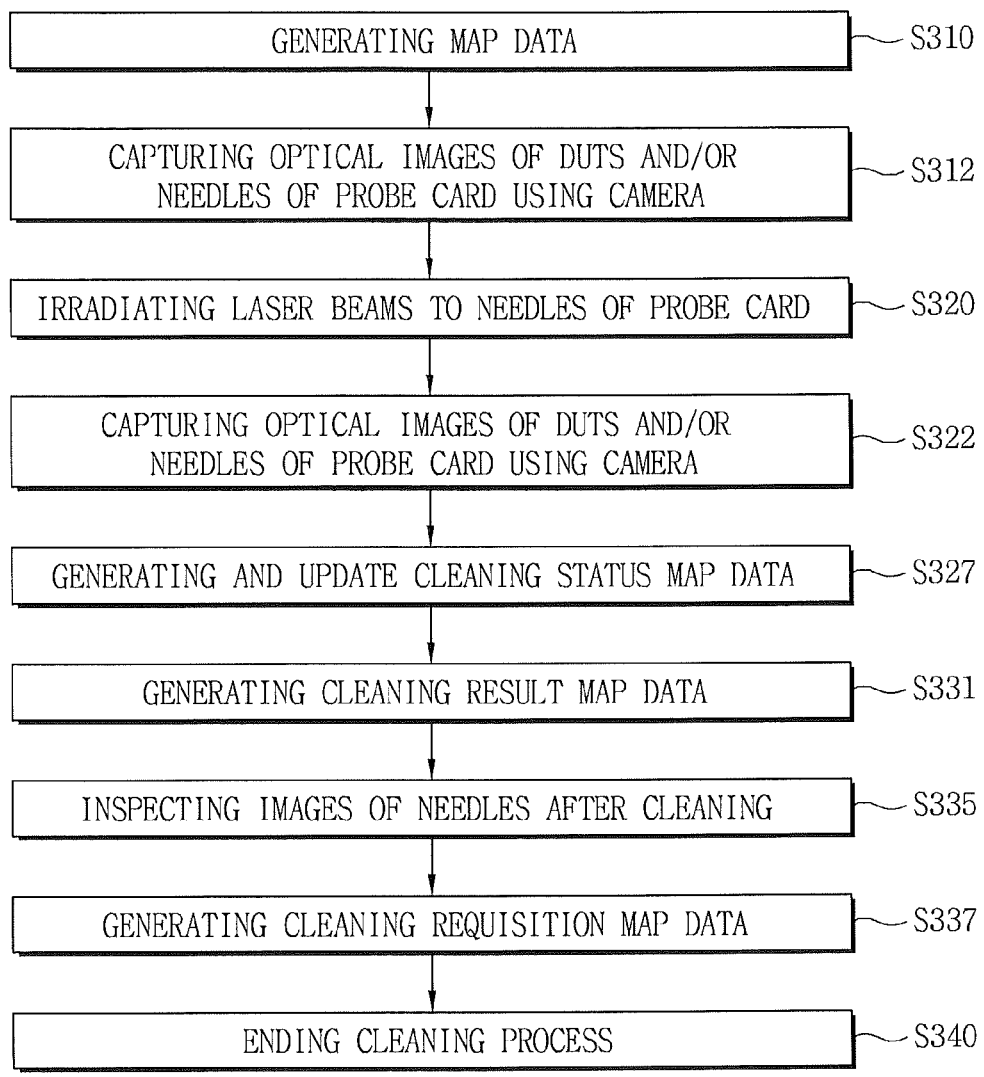

FIG. 10D is a flowchart illustrating a method of blanket-cleaning the needles 193 of the probe card 190 according to embodiments of the inventive concept. The method of blanket-cleaning the needles 193 of the probe card 190 may include inspecting images of the cleaned needles 193 (operation S335). For example, the method of blanket-cleaning the needles 193 of the probe card 190 may include correlating, by the control part 155, the images of the cleaned needles 193 with images of normal needles 193. The inspection of the images of the cleaned needles 193 may include comparing the correlation result with/without a threshold value and determining whether the cleaned needles 193 have been normally/sufficiently cleaned or an additional cleaning process is required. In addition, when there are needles 193 that require the additional cleaning process, the method of blanket-cleaning the needles 193 of the probe card 190 according to the embodiments of the inventive concept may include generating cleaning requisition map data including coordinates and/or images of the DUTs 192 or the needles 193 that require the additional cleaning process (operation S337). When there are needles 193 that require the additional cleaning process, a process of selectively cleaning, the probe card 190 may be performed. The selective cleaning of the needles 193 of the probe card 190 will be described later herein. In some embodiments, immediately before irradiating laser beams to the DUTs 192 and/or the needles 193 of the probe card 190, the blanket-cleaning method may further include capturing optical images of the DUTs 192 and/or the needles 193 of the probe card 190 using the camera 177 (operation S312).

Figure 11:
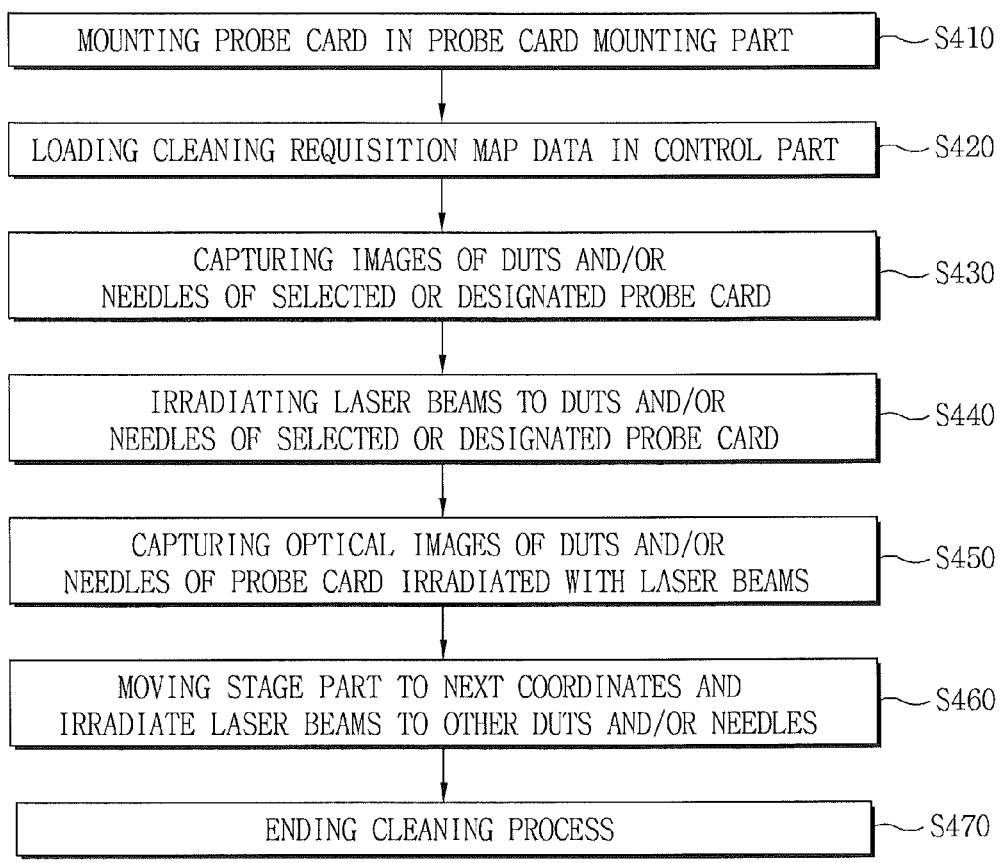
FIG. 11 is a flowchart illustrating a method of selectively cleaning needles of a probe card according to embodiments of the inventive concept.

FIG. 11 is a flowchart illustrating a method of selectively cleaning the needles 193 of the probe card 190 according to embodiments of the inventive concept. Referring to FIG. 11, the method of selectively cleaning the needles 193 of the probe card 190 may include mounting a probe card 190 to be cleaned, in the probe card mounting part 115 (operation S410).

Next, the method of selectively cleaning the needles 193 of the probe card 190 may include loading the cleaning requisition map data including the coordinates and/or images of the DUTs 192 and/or the needles 193 to be cleaned, in the control part 155 (operation S420).

Thereafter, the method of selectively cleaning the needles 193 of the probe card 190 may include capturing optical images of selected or designated DUTs 192 and/or needles 193 of the probe card 190 using the camera 177 with reference to the cleaning requisition map data (operation S430). The captured images may be transmitted to the control part 155. Also, the captured images may be displayed on the monitor 150 of the test system 100.

Next, the method of selectively cleaning the needles 193 of the probe card 190 may include irradiating laser beams to the selected or designated DUTs 192 and/or needles 193 of the probe card 190 with reference to the cleaning requisition map data (operation S440). The irradiation of the laser beams to the selected or designated DUTs 192 and/or needles 193 of the probe card 190 may include moving the stage part 170 to coordinates of the DUTs 192 and/or needles 193 to be cleaned, with reference to (based on) the cleaning requisition map data.

Thereafter, the method of selectively cleaning the needles 193 of the probe card 190 may include capturing optical images of the DUTs 192 and/or needles 193 of the probe card 190 using the camera 177 directly after irradiating laser beams (operation S450). The captured images of the DUTs 192 and/or needles 193 of the probe card 190 may be transmitted to the control part 155 and/or displayed on the monitor 150 of the test system 100.

Next, when the DUTs 192 and/or needles 193 of the probe card 190 are sufficiently cleaned, the method of selectively cleaning the needles 193 of the probe card 190 may include moving the stage part 170 to the next coordinates and irradiating laser beams to other DUTs 192 and/or needles 193 (operation S460). In some embodiments, when the needles 193 are not sufficiently cleaned, the method of selectively cleaning the needles 193 of the probe card 190 may include irradiating laser beams again on the not yet clean needles 193. The process of determining whether the needles 193 have been sufficiently cleaned may include checking an image displayed on the monitor 150 with the naked eye and/or correlating/comparing images of the needles 193 to be cleaned and the cleaned needles 193.

Thereafter, the method of selectively cleaning the needles 193 of the probe card 190 may include ending the selective cleaning process after cleaning the DUTs 192 and/or needles 193 corresponding to all coordinates of the cleaning requisition map data. In addition, the method of selectively cleaning the needles 193 of the probe card 190 according to some embodiments of the inventive concept may generate cleaning completion map data obtained by updating the cleaning requisition map data.

A test system configured to clean needles of a probe card according to embodiments of the inventive concept can automatically scan the probe card using a camera, and directly generate map data of DUTs and needles provided in various shapes in the probe card.

The test system configured to clean the needles of the probe card according to some embodiments of the inventive concept can automatically clean the needles of the probe card using laser beams irrespective of the kind of the probe card.

As the test system configured to clean the needles of the probe card according to some embodiments of the inventive concept includes a laser beam provider mounted outside a main body, components provided for laser beams can be easily inspected, maintained, and replaced.

As the test system configured to clean the needles of the probe card according to some embodiments of the inventive concept includes a monitor, a test process and a cleaning process can be inspected and checked in real-time.

In the test system configured to clean the needles of the probe card according to some embodiments of the inventive concept, components configured to test a wafer, components configured to scan the probe card, and components configured to clean the probe card can independently move, and the respective components can be precisely and easily controlled, inspected, and repaired.

As the test system configured to clean the needles of the probe card according to some embodiments of the inventive concept has both a wafer test function and a probe-card cleaning function, a semiconductor fabrication process can be performed in real-time or in succession without interruption, thereby increasing productivity.

According to a method of cleaning needles of a probe card according to embodiments of the inventive concept, as an image of the probe card can be automatically captured using a camera, map data of DUTs and needles provided in various shapes in the probe card can be immediately generated.

According to the method of cleaning the needles of the probe card according to some embodiments of the inventive concept, as the image of the probe card can be automatically captured using the camera, precise processes can be performed at high speed without losing time, and process productivity can be increased.

According to the method of cleaning the needles of the probe card according to some embodiments of the inventive concept, as the image of the probe card can be automatically captured using the camera, a cleaning position can be precisely defined.

According to the method of cleaning the needles of the probe card according to embodiments of the inventive concept, as the needles of the probe card can be cleaned using laser beams, the lifespan of the probe card can be extended without wearing away the needles.

According to the method of cleaning the needles of the probe card according to embodiments of the inventive concept, as the image of the probe card can be automatically captured using the camera and displayed on the monitor, a cleaning process can be precisely performed.

According to the method of cleaning the needles of the probe card according to embodiments of the inventive concept, as images of needles to be cleaned and cleaned needles can be captured, the cleaning process can be precisely monitored.

According to the method of cleaning the needles of the probe card according to embodiments of the inventive concept, only needles to be cleaned can be automatically probed and cleaned.

According to the method of cleaning the needles of the probe card according to embodiments of the inventive concept, cleaning status and cleaning results can be inspected and checked in real-time.

The foregoing is illustrative of the present inventive concept and is not to be construed as limiting thereof. Although a few embodiments of the present inventive concept have been described, those skilled in the art will readily appreciate that many modifications are possible in the embodiments without materially departing from the novel teachings and advantages of the present inventive concept. Accordingly, all such modifications are intended to be included within the scope of the present inventive concept as defined in the claims. Therefore, it is to be understood that the foregoing is illustrative of the present inventive concept and is not to be construed as limited to the specific embodiments disclosed, and that modifications to the disclosed embodiments, as well as other embodiments, are intended to be included within the scope of the appended claims. The present inventive concept is defined by the following claims, with equivalents of the claims to be included therein.

What is claimed is:

1. A method of cleaning needles of a probe card in a test system, the method comprising:
    mounting the probe card having a plurality of devices under test (DUTs) in a card mounting part, each DUT comprising needles;
    scanning the DUTs and the needles of each DUT using a camera positioned in the test system to provide a scan result;
    focusing a laser beam on at least one of the needles based on the scan result; and
    irradiating the laser beam on the at least one of the needles to clean the at least one of the needles,
    wherein the laser beam comprises a plurality of laser beams and the at least one needle comprises a plurality of needles and wherein focusing the laser beams comprises comparing the scan result with a stored image corresponding to a case where the laser beams are focused on the needles and moving the laser beams or the probe card to focus the laser beams on the needles based on the comparison of the scan result and the stored image.

2. The method of claim 1, wherein irradiating the laser beam on the at least one of the needles is followed by scanning the cleaned needles using the camera to provide a cleaning result image.

3. The method of claim 2, wherein scanning the cleaned needles is followed by:
    identifying needles that are not yet clean based on the cleaning result image; and
    repeating focusing the laser beams and irradiating the laser beams on the needles that are identified as not yet clean.

4. The method of claim 3, wherein identifying ones of the needles includes displaying the cleaning result image on a monitor of the test system.

5. The method of claim 1, wherein scanning the DUTs and the needles of each DUT comprises:
    determining coordinates associated with the needles; and
    generating a needle map based on the determined coordinates as the scan result.

6. The method of claim 1, wherein the scan result comprises an optical image of the needles of each DUT captured by the camera.

7. The method of claim 1, wherein scanning the DUTs and the needles of each DUT includes focusing the camera on a same location as the laser beams.

8. The method of claim 1, wherein scanning the DUTs and the needles of each DUT is preceded by obtaining cleaning requisition map data, the cleaning requisition map data including information regarding coordinates of the DUTs and the needles of each DUT of the probe card and wherein focusing the laser beams includes focusing the laser beams based on the cleaning requisition map data and the scan result.

9. The method of claim 8, wherein obtaining the cleaning requisition map data includes obtaining cleaning requisition map data for a plurality of different configuration DUTs and selecting cleaning requisition map data to be used for focusing the laser beams based on a type of probe card to be cleaned.

10. A method of cleaning needles of a probe card, the method comprising:
    preparing a test system comprising a main body and including a monitor disposed outside the main body of the test system, a stage part disposed inside the main body of the test system and having a camera and a laser beam irradiating part, and a probe card mounting part disposed in an upper portion of the test system;
    mounting a probe card having a plurality of devices under test (DUTs) in the probe card mounting part, each DUT comprising needles;
    scanning the DUTs and the needles of each DUT using the camera;
    focusing laser beams on the needles to be irradiated by the laser beam irradiating part; and
    irradiating the laser beams on the needles,
    wherein the scanning of the needles comprises storing coordinates of the needles and generating a needle map, wherein the scanning of the needles comprises capturing optical images of the needles using the camera, and wherein the scanning of the DUTs comprises storing coordinates of the DUTs and generating a DUT map, and
    wherein the test system further comprises a stage moving part installed under the stage part and configured to be capable of moving the stage part in each of X-, Y-, and Z-axial directions,
        wherein the focusing of the laser beams on the needles comprises correlating the image captured by the camera with an image corresponding to a case where the laser beams are focused on the needles and moving the stage part such that coordinate location of the needles of the two correlated images are consistent.

11. The method of claim 10, wherein the test system further comprises a control part,
wherein the camera converts the captured optical images into digital images and transmits the digital images to the control part, and the control part stores the received images.

12. A method of cleaning needles of a probe card, the method comprising:
preparing a test system comprising a main body and including a monitor installed outside the main body of the test system, a stage part installed in the main body of the test system and having a camera and a laser beam irradiating part, a probe card mounting part installed in an upper portion of the test system, and a control part;
mounting a probe card having a plurality of devices under test(DUTs) on the probe card mounting part, each DUT comprising needles;
loading cleaning requisition map data in the control part, the cleaning requisition map data having information regarding coordinates of the needles on each DUT of the probe card;
irradiating laser beams on the needles of the probe card using the laser beam irradiating part based on the cleaning requisition map data;
capturing optical images of the needles irradiated with the laser beams, using the camera; and
generating a cleaning map including the captured images,
wherein irradiating the laser beams on the needles based on the cleaning requisition map data comprises comparing the cleaning requisition map data with a stored image corresponding to a case where laser beams are focused on the needles and moving the laser beams or the probe card to irradiate laser beams on the needles based on the comparison of the cleaning requisition map data and the stored image.

13. The method of claim 12, further comprising scanning the needles of the probe card using the camera and focusing the laser beams on the needles before irradiating the laser beams on the needles.

14. The method of claim 12, further comprising updating the cleaning requisition map data to indicate needles of each DUT irradiated with the laser beams and generating cleaning status map data.

15. The method of claim 14, wherein the cleaning status map data includes the optical images of the needles irradiated with the laser beams.

16. The method of claim 12, further comprising capturing optical images of the needles to be irradiated with the laser beams before irradiating the laser beams on the needles.

17. The method of claim 16, further comprising correlating the optical images of the needles irradiated with the laser beams with the optical images of the needles to be irradiated with the laser beams and determining a cleaning result.

* * * * *